United States Patent
Federspiel et al.

(10) Patent No.: US 8,634,962 B2
(45) Date of Patent: Jan. 21, 2014

(54) METHOD AND APPARATUS FOR EFFICIENTLY COORDINATING DATA CENTER COOLING UNITS

(75) Inventors: Clifford C. Federspiel, El Cerrito, CA (US); Kurt Federspiel, Roseville, CA (US); Jerry Chin, Mountain View, CA (US)

(73) Assignee: Vigilent Corporation, El Cerrito, CA (US)

( * ) Notice: Subject to any disclaimer, the term of this patent is extended or adjusted under 35 U.S.C. 154(b) by 585 days.

(21) Appl. No.: 12/860,820

(22) Filed: Aug. 20, 2010

(65) Prior Publication Data

US 2011/0203785 A1    Aug. 25, 2011

Related U.S. Application Data

(60) Provisional application No. 61/235,759, filed on Aug. 21, 2009.

(51) Int. Cl.
 *G05D 23/00*    (2006.01)

(52) U.S. Cl.
 USPC ............................................ 700/276; 700/300

(58) Field of Classification Search
 USPC .................................. 700/276–278, 299–300
 See application file for complete search history.

(56) References Cited

U.S. PATENT DOCUMENTS

| | | | |
|---|---|---|---|
| 5,170,935 A | 12/1992 | Federspiel et al. | |
| 5,464,369 A | 11/1995 | Federspiel | |
| 5,550,752 A | 8/1996 | Federspiel | |
| 5,768,121 A | 6/1998 | Federspiel | |
| 5,862,982 A | 1/1999 | Federspiel | |
| 5,875,109 A | 2/1999 | Federspiel | |
| 6,101,459 A * | 8/2000 | Tavallaei et al. | 702/132 |
| 6,470,230 B1 * | 10/2002 | Toprac et al. | 700/121 |
| 6,557,574 B2 | 5/2003 | Federspiel | |

(Continued)

FOREIGN PATENT DOCUMENTS

| | | |
|---|---|---|
| EP | 0501432 B1 | 7/1994 |
| JP | 05-231693 A | 9/1993 |
| JP | 06-323595 A | 11/1994 |
| WO | WO 2006/099337 A2 | 9/2006 |

OTHER PUBLICATIONS

Search/Examination Report dated Oct. 20, 2010 from International Patent Application No. PCT/US2010/046228, 13 pages.

(Continued)

*Primary Examiner* — Sean Schechtman
(74) *Attorney, Agent, or Firm* — Kilpatrick Townsend & Stockton, LLP; David B. Raczkowski

(57) ABSTRACT

Systems, apparatus, and methods for controlling environmental maintenance modules (e.g. HVAC units) using sensors are provided. Values measured by the sensors can be used to determine a change in operation levels of the modules to keep the sensor values within a desired range. For example, a stopped module can be increased or started for more cooling when a sensor temperature is too hot. The module predicted to have the greatest effect on the temperature of hot sensor can be started. A transfer matrix, which provides a relation between a change in operation level and resulting sensor changes, can be used to perform the above predictions. As another example, a module can be stopped (or otherwise have an operation level decreased), if the sensor temperatures are within range, and the decrease in operation level is predicted not to cause an out-of-range condition.

26 Claims, 11 Drawing Sheets

(56) References Cited

U.S. PATENT DOCUMENTS

| | | |
|---|---|---|
| 6,719,625 B2 | 4/2004 | Federspiel |
| 7,117,129 B1 | 10/2006 | Bash et al. |
| 8,374,731 B1 * | 2/2013 | Sullivan ........................ 700/299 |
| 2002/0020446 A1 | 2/2002 | Federspiel |
| 2003/0064676 A1 | 4/2003 | Federspiel |
| 2003/0067745 A1 | 4/2003 | Patel et al. |
| 2003/0200050 A1 | 10/2003 | Sharma |
| 2004/0065097 A1 | 4/2004 | Bash et al. |
| 2005/0096789 A1 * | 5/2005 | Sharma et al. ................ 700/245 |
| 2006/0116067 A1 | 6/2006 | Federspiel |
| 2006/0206291 A1 | 9/2006 | Bash et al. |
| 2007/0089446 A1 | 4/2007 | Larson et al. |

OTHER PUBLICATIONS

Written Opinion mailed Feb. 14, 2013 in Singaporean Patent Application No. 201201144-1, 10 pages.

* cited by examiner

METHOD AND APPARATUS FOR EFFICIENTLY COORDINATING DATA CENTER COOLING UNITS

CROSS-REFERENCES TO RELATED APPLICATIONS

The present application claims priority from and is a non-provisional application of U.S. Provisional Application No. 61/235,759 by C. Federspiel et al., entitled "Method And Apparatus For Coordinated Starting And Stopping Of Datacenter Cooling Units" filed Aug. 21, 2009, the entire contents of which are herein incorporated by reference for all purposes. The present application is also related to U.S. Non-Provisional application Ser. No. 12/396,944 by C. Federspiel, entitled "Method and Apparatus for Coordinating the Control of HVAC Units" filed Mar. 3, 2009, the entire contents of which are herein incorporated by reference for all purposes.

BACKGROUND

The present invention generally relates to environmental control systems, such as heating, ventilation, and air conditioning (HVAC) systems, which can be used to control the temperature and humidity of common spaces, e.g., as can exist in data centers containing server computers. More, specifically the present invention can relate to efficiently maintaining certain environmental conditions by increasing or decreasing an operation level (e.g. starting and stopping) of respective units (modules) of an environmental control system.

Modern datacenters use HVAC systems to control indoor temperature, humidity, and other variables. It is common to have many HVAC units deployed throughout a data center. They are often floor-standing units, but may be wall-mounted, rack-mounted, or ceiling-mounted. The HVAC units also often provide cooled air either to a raised-floor plenum, to a network of air ducts, or to the open air of the data center. The data center itself, or a large section of a large data center, typically has an open-plan construction, i.e. no permanent partitions separating the air in one part of the data center from the air in another part. Thus, in many cases, these data centers have a common space is temperature-controlled and humidity-controlled by multiple HVAC units.

HVAC units for data centers are typically operated with decentralized, stand-alone controls. It is common for each unit to operate in an attempt to control the temperature and humidity of the air entering the unit from the data center. For example, an HVAC unit may contain a sensor that determines the temperature and humidity of the air entering the unit. Based on the measurements of this sensor, the controls of that HVAC will alter operation of the unit in an attempt to change the temperature and humidity of the air entering the unit to align with the set points for that unit.

For reliability, most data centers are designed with an excess number of HVAC units. Since the open-plan construction allows free flow of air throughout the data center, the operation of one unit can be coupled to the operation of another unit. The excess units and the fact that they deliver air to substantially overlapping areas provides a redundancy, which ensures that if a single unit fails, the data center equipment (servers, routers, etc.) will still have adequate cooling.

As mentioned above, the standard operating procedure for the HVAC units is to control the return air temperature into each HVAC unit. Such operation is not aware of the temperature of the air entering the servers and other computing equipment in the data center. Since this information is not available to the HVAC unit controls or to the data center operators, the extra HVAC units are typically run at all times, to ensure that the servers are kept cool. However, such precautionary measures waste energy.

While it is possible to manually turn off redundant HVAC units to save energy, doing so poses a risk of overheating that equipment. Also, some data centers have variable loads, in which case it may be necessary to stop and start several units throughout the day. Furthermore, the complex and tightly coupled airflow patterns in a data center make it difficult for an operator to know which HVAC unit will be the most effective to restart should a need be identified.

Therefore, it is desirable to provide methods and systems that can automatically reduce operation levels of redundant HVAC units (e.g. without triggering elevated temperatures), and that can automatically increase operation levels when necessary and in an efficient manner.

BRIEF SUMMARY

Embodiments of the present invention can provide systems and methods for controlling environmental maintenance modules (e.g. HVAC units) using sensors. In various embodiments, a system can heat and/or cool an environment. The sensors can measure temperatures at various locations within the environment, and this temperature feedback can be used to change operation levels of the modules to keep the temperatures within a desired range.

For example, stopped modules can be started (or otherwise have an operation level increased) for cooling when a sensor temperature is too hot. In one embodiment, the module for starting is one that is predicted to have the greatest or at least a sufficiently large effect on the temperature of a hot sensor. As another example, a module can be stopped (or otherwise have an operation level decreased), if the sensor temperatures are within range, and the decrease in operation level is predicted not to cause an out-of-range condition. In one embodiment, a transfer matrix is used to perform the above predictions. In one aspect, the transfer matrix can provide a relation between a change in operation level of a module and resulting temperature differences for each sensor in the system.

According to an embodiment, a method of controlling an environmental maintenance system is provided. The system includes a plurality of environmental maintenance modules and a plurality of sensors, where the sensors measure a value of a physical condition of an environment. A sensor $S_{indx}$ is identified whose sensor value is measured to be outside of a range. For each of at least a portion of the modules, a predicted change value is determined. Each predicted change value predicts an extent that changing an operation level of the respective module changes the sensor value measured by the identified sensor $S_{indx}$. A module is selected based on the predicted change values. The operation level of the selected module is changed to effectuate a change of the sensor value of sensor $S_{indx}$.

According to another embodiment, a method of controlling an environmental maintenance system is provided. The system includes a plurality of environmental maintenance modules currently running and a plurality of sensors that measure a value of a physical condition of an environment. At least one of the plurality of the modules currently running is analyzed. The system estimates sensor values of the sensors that would result if an operation level of the module were decreased by at least a predetermined amount. A first set of the modules currently running that have none of the estimated sensor values outside of a first range is determined. An operation level of at least one module of the first set is decreased in response predicting that an out-of-range condition will not occur (e.g. that none of the estimated sensor values are outside of the first range).

According to another embodiment, a method of initializing an environmental maintenance system is provided. Each module includes one or more actuators. A first sensor value Y1 is received for each of the sensors. An operation level of at least two actuators of the modules is changed at a same time. After the change in operation levels, a second sensor value Y2 is received for each sensor. A difference between the first sensor value Y1 and the second sensor value Y2 is calculated. At least a portion of matrix elements of a transfer matrix TM determined based on the differences. The transfer matrix can have dimensions of a number of actuators by a number of sensors. The portion of TM includes matrix elements associated with the at least two actuators. Determining a matrix element for sensor S and actuator P includes: determining a first ratio having a numerator including the difference for sensor S and having a denominator including the change in operation level for actuator P; and combining the first ratio with at least one other ratio. The at least one other ratio is determined from a previous change of the operation level of actuator P that resulted in a previous difference in the sensor values for sensor S.

According to another embodiment, a method of initializing an environmental maintenance system is provided. At least one processor determines a transfer matrix TM. For each one of the modules, a first sensor value Y1 is received for each of the sensors. Each first sensor value is received when the respective module has a first operation level. Stopping or starting the respective module, and then a second sensor value Y2 is received for each sensor. A difference is calculated between the first sensor value Y1 and the second sensor value Y2. A TM matrix element is calculated using the difference, thereby obtaining a transfer matrix TM that provides a relation between starting and/or stopping a module and resulting changes in the sensor values for each sensor.

Other embodiments of the invention are directed to systems, devices, and computer readable media associated with methods described herein.

As used herein, an environmental maintenance module may be an HVAC unit, a computer room air conditioner (CRAC) unit, or any device that receives control signals and provides an output that is designed to achieve or maintain an environmental condition in a specific area. A use herein, an operation level can be a value of an operational parameter (input or output) that measures how much effort is being expended by a module to perform an operation, such as heating of cooling. Operation levels of a module can include stopped, operating at full power, percentages of input power levels, percentages or values for operation of a particular device within the module (e.g. a fan speed, temperature setpoint, humidity setpoint, or valve position), and percentages or values of the output heating or cooling power of the output air stream, e.g., as compared to a reference level.

A better understanding of the nature and advantages of the present invention may be gained with reference to the following detailed description and the accompanying drawings.

DETAILED DESCRIPTION

To ensure that an environment (e.g. a data center) is sufficiently cool or warm, standard operating procedure is to operate extra HVAC units (or other environmental maintenance modules) beyond what is marginally required. However, such precautionary measures waste energy. Various embodiments can analyze sensors throughout the environment (e.g., sensors across modules or at locations outside of modules) to determine whether the operation levels of specific modules can be safely reduced and whether increased operation is required (e.g. due to an out-of-range measurement), including which module is optimal for bringing the sensor back in range. Such embodiments can provide stable environments while reducing energy consumption. A transfer matrix can be used in performing the above determinations. In one aspect, the transfer matrix can provide a relation between a change in operation level of a module and resulting temperature differences for each sensor in the system.

Another problem with running many redundant HVAC units, particularly when they deliver air to an underfloor plenum is that the discharge air temperature from the HVAC units can be higher than if fewer HVAC units were used. The discharge air temperature can be higher because, with more HVAC units being used, the temperature can be higher while still extracting the same amount of heat from the servers. In other words, a greater airflow (with the higher number of HVAC units) for extracting heat from the servers means that the discharge temperatures from the HVAC units can be higher. As a result, a concrete slab floor or a raised floor will not be as cool, which diminish disaster recovery capabilities. For example, having a cool floor increases the time available to recover from a cooling failure (e.g. when power is cut off for an entire building) because the slab and floor acts as cool storage media (heat sink). A colder temperature of a floor can keep the servers cooler when the HVAC units are not pushing out cool air, e.g., due to power being cut off.

I. System Overview

Figure 1:
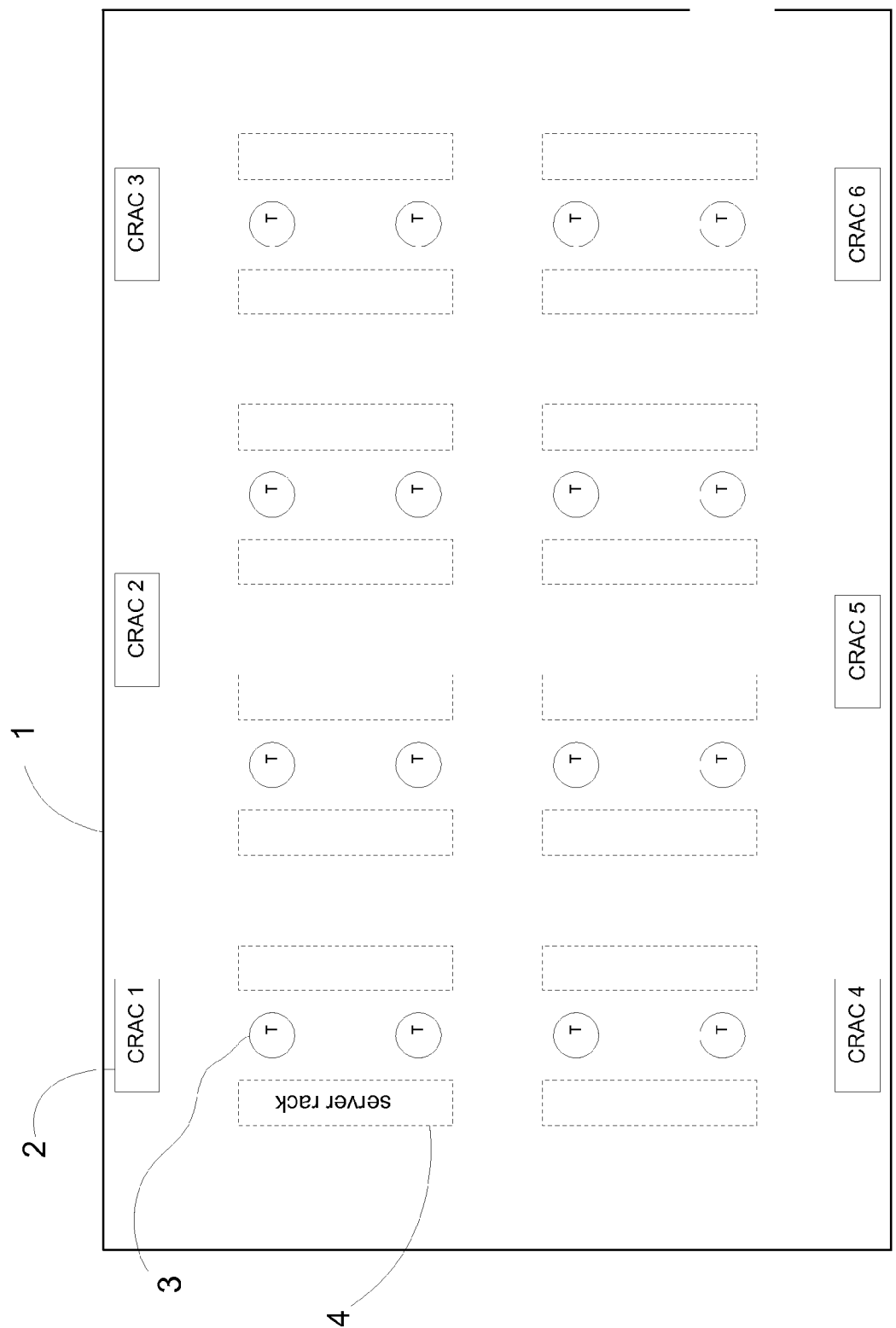
FIG. 1 is a plan view of a data center according to an embodiment of the present invention.

FIG. 1 shows a floor plan of a data center according to an embodiment of the present invention. Perimeter wall 1 may be the perimeter wall of a data center or the perimeter wall of a commercial building such as a retail store. A data center includes a plurality of HVAC units 2 (or other environmental maintenance modules), a plurality of environmental sensors 3, and a plurality of server racks 4. As shown, the HVAC units are computer room air conditioner (CRAC) units.

In one embodiment, HVAC units 2 are unitary equipment that provide airflow to the data center to cool servers in server racks 4. In one aspect, HVAC units 2 can cool, heat, humidify, or dehumidify air that passes through them. Environmental sensors 3 are devices that measure environmental parameters, such as temperature or humidity. Environmental sensors 3 can transmit measurements (also called readings) by any means, such as by wired or wireless communication means (e.g., Modbus, BACnet, Wi-Fi, WiMAX, ZigBee, or any other applicable protocol). The HVAC units 2 (and other modules mentioned herein) can be controlled by a computer system with one or more processors to provide specified conditions within the data center.

Figure 2:
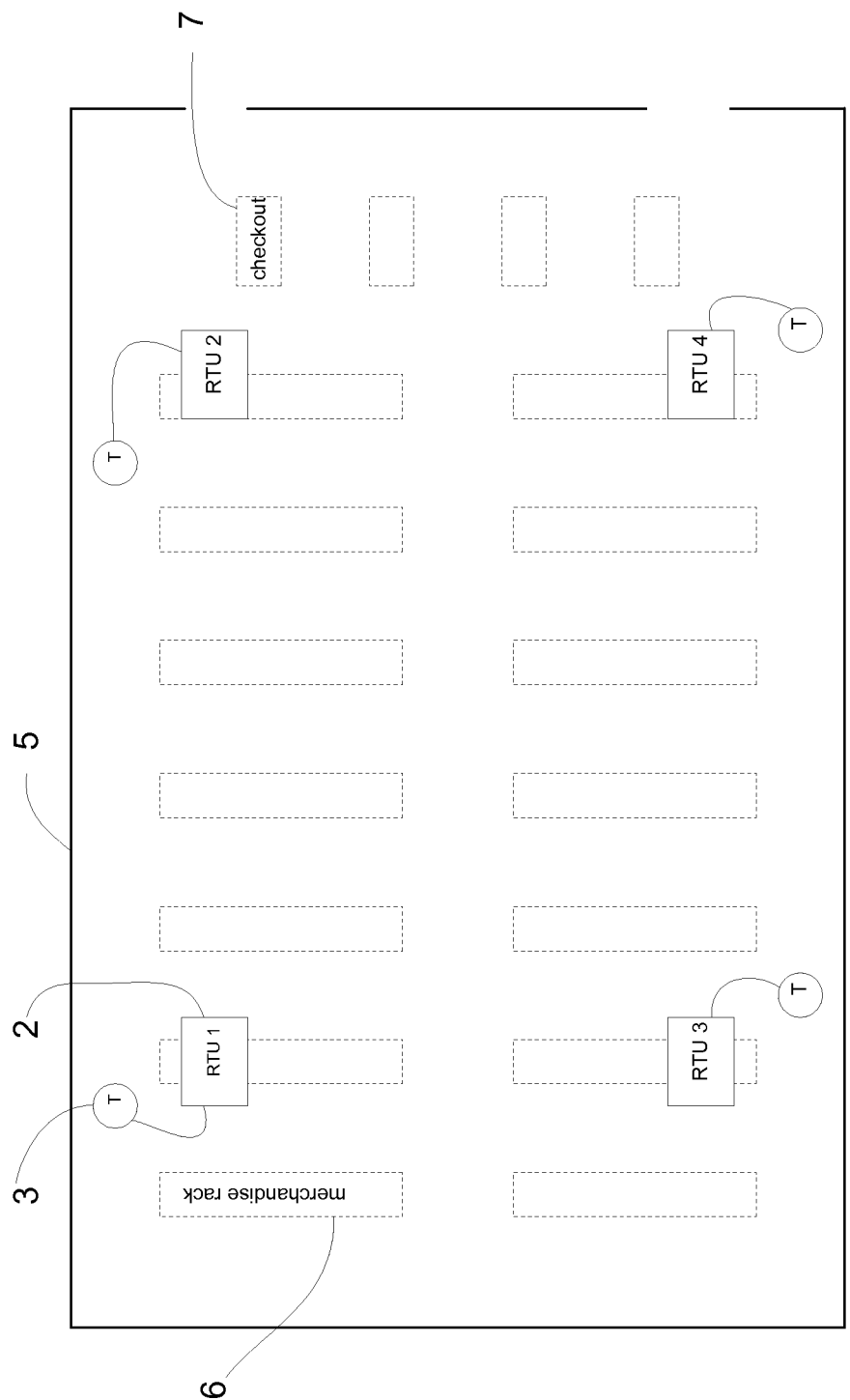
FIG. 2 is a plan view of an open-plan building conditioned by unitary rooftop units according to an embodiment of the present invention.

FIG. 2 is a plan view of an open-plan building conditioned by unitary rooftop units according to an embodiment of the present invention. In this example, the HVAC units are roof top units (RTU) 2. Perimeter wall 5 is an outside or inside wall of a commercial building such as a retail store or space within such a building or store. As depicted, a wired communication occurs between the RTU 2 and sensors 3 near that particular RTU, but wireless communications may also be used. Merchandise racks 6 and a store checkout counter 7 are also shown.

Figure 3:
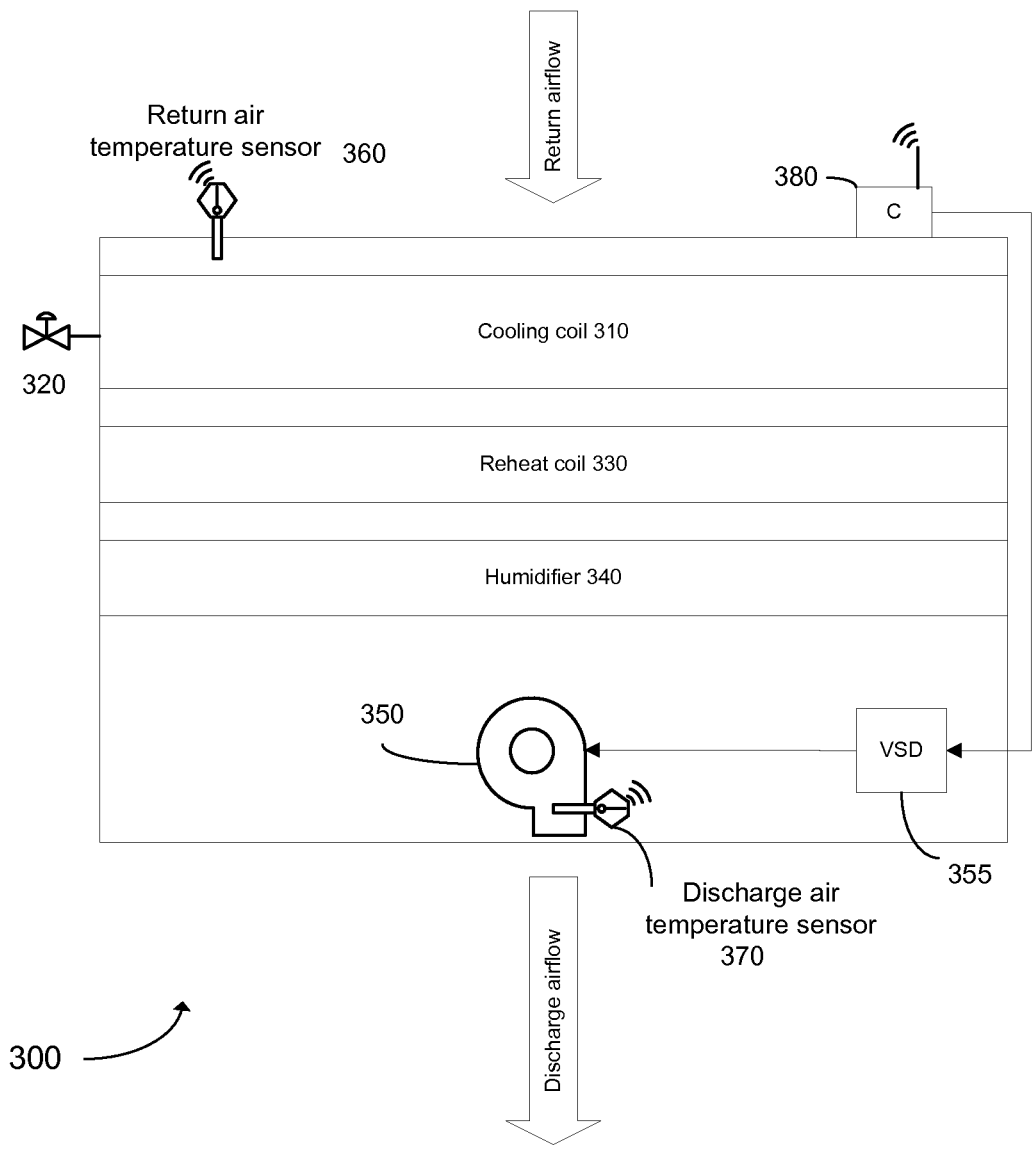
FIG. 3 is a schematic diagram of a computer room air handling unit 300 according to an embodiment of the present invention.

FIG. 3 is a schematic diagram of a computer room air handling unit 300 according to an embodiment of the present invention. Computer room air handling unit 300 is an example of an environmental maintenance module. As shown, computer room air handling unit 300 has a cooling coil 310, which may contain chilled water modulated by a chilled water valve 320. The computer room air handling unit 300 also has a reheat coil 330 (e.g. an electric coil) and a humidifier 340 (e.g. an infrared humidifier).

In one embodiment, fan 350 is a centrifugal fan driven by an A/C induction motor. The induction motor may have a variable speed (frequency) drive VSD 355 for changing its speed. A wireless sensor 360 measures return air temperature, a wireless sensor 370 measures discharge air temperature, and a wireless control 380 to control the VSD 355. The discharge air temperature sensor 370 and return air temperature sensors 360 may be probes tethered to the wireless control 380 rather than separate wireless sensors.

Figure 4:
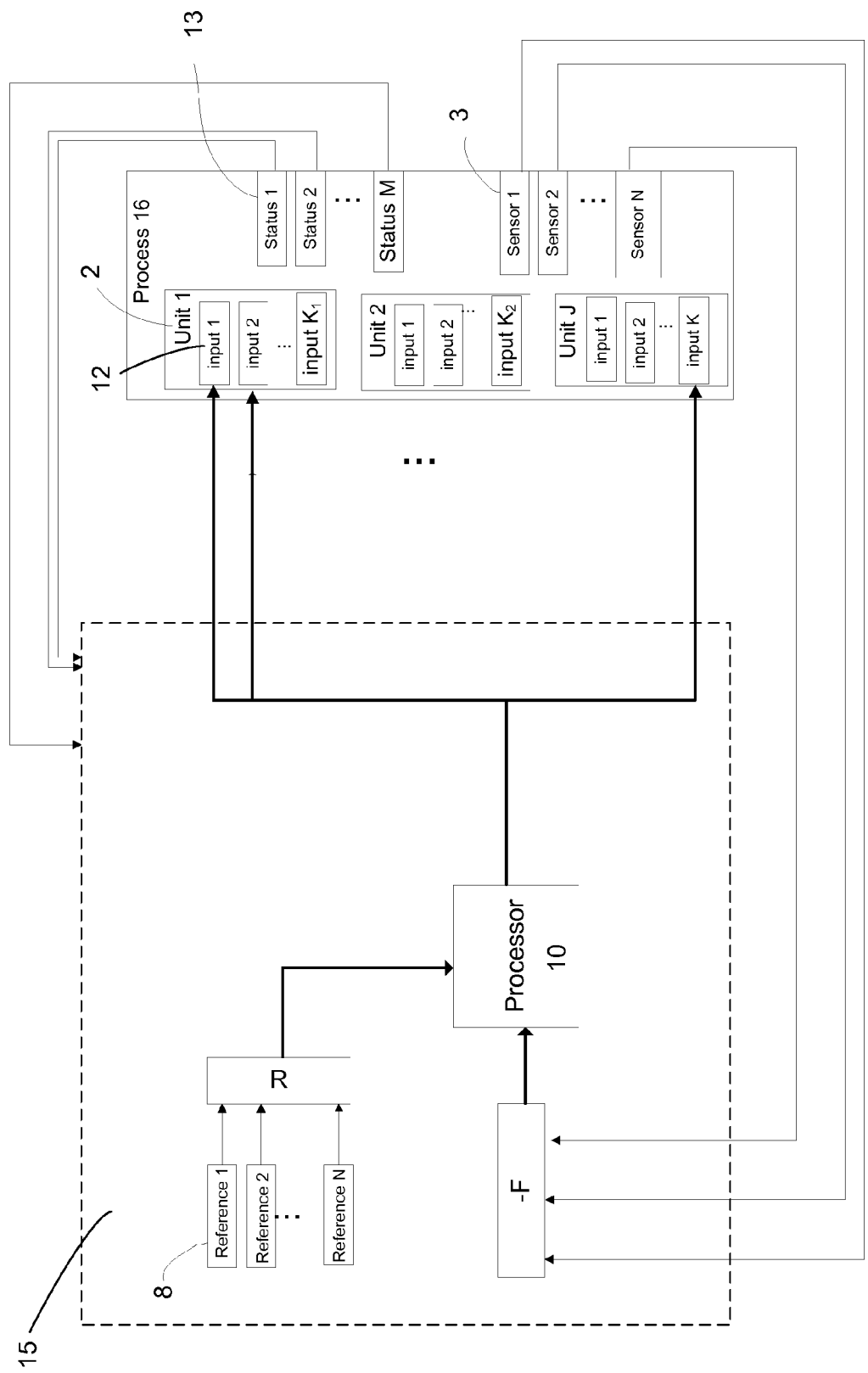
FIG. 4 is a block diagram of a control system 400 for providing maintenance of environmental conditions within a building according to an embodiment of the present invention.

In one embodiment of operation, the wireless sensors 360, 370 send readings over the radio to a wireless network gateway, which passes the signals to a control computer, e.g. which contains supervisory controller 15 of FIG. 4. Supervisory control 15 may be a computer system itself. The control computer can send actuation commands to the wireless gateway, which relays the commands to the wireless control 380, which changes the speed of the variable speed drive 355.

FIG. 4 is a block diagram of a control system 400 for providing maintenance of environmental conditions within a building according to an embodiment of the present invention. In this example, control system 400 comprises HVAC units 2 (such as unit 300), a plurality of environmental sensors 3, and a supervisory controller 15, which includes one or more processors 10 for performing calculations. The HVAC units 2 include final control elements (also called actuators), e.g., for fans, valves, or temperature elements, which may be used in maintaining the environment of a space. Inputs and outputs of the actuators may correspond to operation levels of a module, as mentioned herein. In one aspect, supervisory controller 15 can control the final control elements to have operation levels (including on and off, and variations in between) to provide stable environmental conditions using a reduced or minimal amount of energy.

Modules (HVAC Units)

In some embodiments, supervisory controller 15 can coordinate the operation of multiple HVAC units 2 by computing commands to inputs 12 of each HVAC unit 2. The commands are computed based on the environmental sensor readings from the sensors 3. The inputs 12 may correspond to a variety of different HVAC units 2 and/or devices or circuits within the HVAC units 2.

In one embodiment, input 1 of HVAC unit 1 may correspond to the operational parameter of one actuator (e.g. a fan, temperature setpoint, humidity setpoint, or valve position), and the input 2 of HVAC unit 1 may correspond to a different actuator of the same HVAC unit 1. The operational parameter may have different operation values (levels), each resulting in a consumption of different amounts of energy. In another embodiment, some of the HVAC units 2 have only one input for control of an operation level.

In other embodiments, a setpoint for the temperature of an HVAC unit 2 can also be provided from supervisory controller 15. For example, a setpoint may be the desired temperature of the air discharged by the HVAC unit 2, or the desired temperature of the air returning to the unit. Other inputs could be the setpoint for the humidity (or the humidifier command), or a command to a variable frequency drive (VFD).

In one embodiment, each HVAC unit has the same number of inputs, each corresponding to one actuator of that HVAC unit. In another embodiment, different HVAC units may have a different number of actuators. In such an embodiment, the number of sensors may be the same regardless of the total number of actuators. In part, a reason the number of sensors may stay the same is because each sensor may affect each actuator, and vice versa. For example, a temperature actuator (e.g. cooling valve) can affect the humidity as may happen when condensate forms on the cooling coil if the environment is cold enough. Likewise, humidity actuators (e.g. infrared humidifiers and evaporative cooling valves) affect the temperature, as may happen when infrared humidifiers raise humidity or evaporative coolers raise humidity.

Sensors

Environmental sensors 3 can measure a value of a physical condition of an environment, such as temperature, humidity, and pressure. Environmental sensors 3 can send their readings back to supervisory controller 15, e.g., by wired or wireless communication means (such as Modbus, BACnet, Wi-Fi, WiMAX, ZigBee, or any other applicable protocol). Examples of sensors include temperature sensors, humidity sensors, and pressure sensors. A single sensor may be able to measure multiple environmental condition, e.g., all three of the above conditions. The environmental sensors 3 may be positioned randomly or according to a regular pattern. The environmental sensors 3 may also be organized via clusters of sensors or individually placed.

In some embodiments, supervisory controller 15 causes temperature sensor readings F to be within a temperature range R, e.g., as specified by an associated set of reference values 8. The range can simply be less than a certain temperature (e.g. less than 78 degrees Fahrenheit). The range can also be specified by two temperatures. Such a temperature range can be as small or as large as is desired. Such ranges can also be applied to heating. Certain embodiments can attempt to maintain a specified temperature range for each temperature (all of which may be different or be the same for each temperature sensor) while using a minimal amount of energy.

In one embodiment, supervisory controller 15 internally stores the set of desired reference values 8 for each environmental sensor, e.g. in flash memory, cache, or other suitable memory. In other embodiments, the reference values 8 may be stored externally, e.g. in a disk drive or optical drive. In operation, supervisory controller 15 adjusts operation levels of HVAC units 2 to keep the values from environmental sensors 3 with the specified range using a minimal amount of energy (e.g. by having the fewest possible modules running without exceeding the temperature range).

Inputs to HVACs

In one embodiment, supervisory controller 15 computes commands that are provided to inputs 12 and are used directly for final control elements (e.g. actuators) in HVAC units 2. These commands sent to the inputs 12 may be provided, e.g., by wired or wireless communication means. These commands may start, stop, or change any number of operation levels of the HVAC units 2.

In another embodiment, supervisory controller 15 computes commands to the inputs 12 that are used by a local digital controller (e.g. having microprocessor-based controls) in an HVAC unit 2. In one aspect, each input to the local digital controller of a unit corresponds to an actuator of the unit. The local digital controller can then determine the final commands sent to the final control elements. For example, the local digital controller may convert a digital signal to an analog signal for the actuator, or convert a protocol of the signal to be usable by an actuator. The local digital controller may also operate to maintain an actuator at a particular setting through a local control loop. Thus, supervisory controller 15 may command the setpoints of local control loops in the local digital controllers rather than directly commanding the final control elements.

Status Indicators

In one embodiment, supervisory controller 15 has means of receiving status indicators 13 from the environmental sensors 3 and/or the HVAC units 2. In one aspect, the status indicators 13 can provide information as to whether an HVAC unit 2 or a sensor 3 is presently operational. In another aspect, the status indicators 13 can provide settings of the HVAC units, such as return air temperature, discharge temperature, portion (e.g. percent) of the capacity of the unit that is being used (which is an example of an operation level), and how much a chilled water valve (e.g. 320) is open. The status indicators 13 are shown separated from the HVAC units 2 and sensors 3 for illustrative purposes, and may actually be received from the HVAC unit 2 or sensor 3 themselves.

In one embodiment, the status indicators 13 for the HVAC units 2 may be obtained from local digital controllers of the HVAC units 2. These local digital controllers can be queried by supervisory controller 15 to determine if the local digital controllers or the HVAC units 2 are "on" or "off". If a unit is "off", then the status indicator 13 for that unit's actuators could be a certain value, e.g., zero.

In another example, the environmental sensors 3 have some well-defined and easily detected failure modes. In one aspect, one failure mode is an "unreachable", which means that a gateway, e.g. a network interface of the supervisory controller 15, cannot communicate with the sensor. Another failure mode is an out-of-range voltage (either 0 volts or 1.5 volts), where 0 volts implies that the sensor probe has a short circuit and 1.5 volts indicates that the sensor probe has an open circuit or is missing. Any of these failures may result in a status indicator of zero for that sensor.

During operation of the system 400, not all of the HVAC units 2 may be running in an attempt to conserver energy. However, system 400 may detect a hotspot (e.g. a temperature sensor 3 above a reference temperature) or other event where more cooling (or heating in other embodiments) is desired, and then determine which module should have its operation level increased (e.g. if the module should be turned on). System 400 may also determine when it is acceptable to decrease an operation level (e.g. turn off) of an HVAC unit 2, along with which HVAC units 2 are acceptable for decreasing without causing sensor readings to go out of range. As part of these determinations, a transfer function matrix (TM) and a load matrix (LOAD) may be used.

II. Initializing Transfer Function and Load Matrices

The transfer function matrix (TM) is a measure of the effect of increasing (and potentially equivalently decreasing) an environmental maintenance module on an environmental sensor. The matrix can provide the effect for every sensor in the system, or just a portion of the sensors. In one aspect, the number of rows J of TM can equal the number of environmental sensors (also called cold aisle sensors for embodiments using CRAC units), and the number of columns can equal the number of environmental maintenance modules. Thus, in one embodiment, there is only one column for each module. In such an embodiment, there would be only one measure of the energy consumption of a module, i.e., one parameter for which an operation level is determined. In another embodiment, there may be more than one row for a module, and thus there can be more than one parameter, each providing a measurement of an operation level of the module. Note that the rows and columns may be switched. Also, the term "matrix" may be any indexable array of values.

As described herein, an operation level can be an input or an output value. For example, an input command (e.g. a voltage or digital value) of no power can be an operation level of 0, and an input of full power can be an operation level of 100% or some maximum value. The operation level can also be an input value for a particular actuator, e.g., a fan speed, temperature setpoint, humidity setpoint, or valve position, or an output measurement of the positions of such actuators. In another embodiment, the operation level can also be an output level, e.g., a level of cooling or heating provided. This output level can be a percentage of the actual flow relative to a designed value, which can be exceed thereby providing a percentage of greater than 100%. When the parameter is an output value, there can be one or more input command variables used to change the output parameter.

Figure 5:
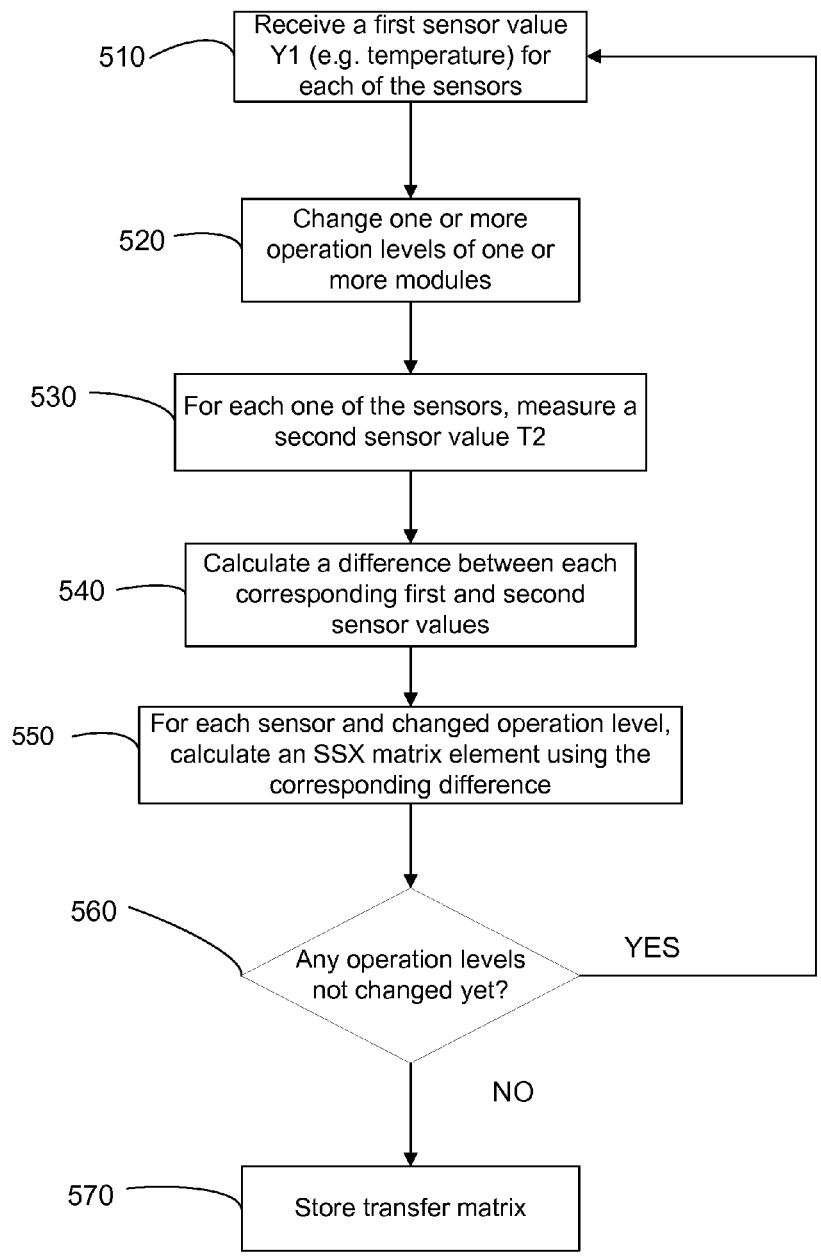
FIG. 5 is a flow diagram illustrating a method 500 of initializing an environmental maintenance system including a plurality of modules (e.g. CRAC units) and sensors according to an embodiment of the present invention.

FIG. 5 is a flow diagram illustrating a method 500 of initializing an environmental maintenance system including a plurality of modules (e.g. CRAC units) and sensors according to an embodiment of the present invention. In describing the method, reference will be made to FIG. 4. The initialization involves the creation of the transfer matrix TM. In one embodiment, the columns of TM are initialized by increasing and/or decreasing operation levels of the modules (e.g. starting and stopping), and taking a difference between temperatures before and after the change in an operation level. In one embodiment, the modules are decreased and increased sequentially (i.e. one at a time). In other embodiments, the columns of TM are initialized by changing the operation levels of multiple modules at a time.

In step 510, a first sensor value Y1 (e.g. temperature, humidity, or pressure) is received (e.g., at controller 15) for each of the sensors (e.g. from sensors 3). The first sensor value Y1 may be actively measured by a computer (e.g. controller 15) as a result of a measurement command, or passively obtained through a port able to receive transmitted messages. The first sensor temperature Y1 for a specific sensor J may be written as $Y1_J$. The first sensor values $Y1_J$ may be obtained once or may be obtained multiple times. For example, the first values Y1 may be obtained before the operation level of any module is changed, or may be obtained each time before the operational level of a particular module is changed.

In addition to the first sensor values Y1, other values may be recorded, such as an operation level of one or more operational parameters of a module. Examples of operational parameters input settings and measured output values, such as return temperatures (e.g. from sensors 360 in FIG. 3), discharge temperatures (e.g. from sensors 370), and flow rates (e.g., design flow rate times VFD percent command if the module has a VFD) may be measured and stored, e.g., in a memory communicably coupled with controller 15.

In step 520, one or more operation levels of one or more modules are changed. In one embodiment, all of the operation levels of a module are changed, which may be just one level. In another embodiment, only some of the operation levels of a module are changed. The operation levels not changed may be changed at another time, or may not be included in the calculation of the transfer matrix. In various embodiments, operation levels from multiple modules may be changed at the same time.

The amount of change in the operation levels may vary or may be equivalent in some manner. For example, each operational parameter that is changed can be changed by the same percentage (e.g. 100%, 50%, 25%, etc.). In one implementation, a 100% is measured against a designed maximum value for the parameter (e.g. 100% of the designed maximum air flow). It is possible to achieve an airflow greater than the designed air flow, and thus the percentage could be greater than 100%.

To determine the exact amount of change achieved for the operation level of a particular parameter, a measurement may be made of the parameter after a change command has been delivered. If the operational parameter is an output value, the new operation level may not be known directly from the change command. For instance, the change command may be to increase an airflow; and there may be some calibrated settings to know generally what airflow corresponds to the command, but the actual value for the airflow may be obtained more accurately by measurement. Also, some parameters may not be known at all except by measurement of an output value. In other embodiments, the change in operational level may be automatically known (e.g., if the change is to turn off, particularly if there is only on and off).

In step 530, a second sensor value Y2 is received for each one of the sensors. In one embodiment, a timer (e.g., with a web-configurable period) is started after the operation level of the module is changed. As a default, the period may be 15 minutes. In one embodiment, the second values Y2 are measured after the end of the timer. In another embodiment, the values are continually measured after the change command has been given, and the second sensor value Y2 is stored after the measured values come to a quasi-steady state condition. For example, the changes outputs of the sensors may have a certain rate of change after the perturbation. Once the rate of change decreases below a threshold, then a quasi-steady state condition may be determined. Absolute values for a threshold of changes in the outputs of the sensors is another example.

In step 540, a difference between each corresponding first sensor temperate Y2 and second sensor values Y2 is calculated (e.g. by processor 10). Thus, if there are N sensors being used, then there are N respective values of $Y2_J-Y1_J$ for each operational parameter that was changed, where J runs from 1 to N. This difference may be positive or negative. Typically for cooling, if the change is an increase in operation level, then the temperatures (the sensor values of interest for cooling) decrease and each $Y2_J-Y1_J$ is negative. Also typical for cooling, if the change is a decrease in operation level, then the temperatures increase and each $Y2_J-Y1_J$ is positive. However, these relations do not always hold true. For example, if the return temperature of a module is at or below a desired discharge temperature, the module may turn off its cooling capacity. Thus, the module would not provide cooling, but actually provide heating since the air would still be blown by a fan, which causes some heat to be imparted to the air. Thus, some transfer matrix elements can have opposite sign of others, which is counterintuitive.

In step 550, a TM matrix element is calculated, for each sensor, using the corresponding difference. For example, processor 10 may calculate the N×K matrix elements, where N is the number of sensors and K is the number of operational parameters changed. In one embodiment, if one operational parameter is changed at a time, then a single column can be updated at a time using a formula for each matrix element. In another embodiment, if more than one operational parameter is changed at a time, then multiple columns are updated at a time, with a combined formula (e.g. recursive least squares) being used to update the matrix elements.

In step 560, it is determined whether any more operational parameters have not been changed yet. If there are, then method 500 may repeat. In one embodiment, assume that the first iteration of method 500 decreased just one operational parameter $P_1$. In the next iteration, step 520 can include increasing the level of parameter $P_1$ to have an operation level of that before the last iteration, and step 520 can include decreasing a level of parameter $P_2$. Thus, one operation level is changed on the first iteration and two operational levels are changed on the second iteration. Other embodiments can have multiple operation levels decreasing and multiple increasing at every iteration. Such embodiments can use a recursive least squares method to determine the matrix elements, as is described below.

In one embodiment, this determination of whether any more operation levels need to be changed is equivalent to whether any more columns of TM need to be initialized. In an embodiment where there is one operation level for a module and the operation level options are on or off, then the determination is whether to start or stop a module. In such an embodiment, if there are more modules that need to be stopped, the stopped modules may then be re-started and other modules may then be stopped to determine other elements of the TM matrix. When a module is re-started, a start-stop timer can be restarted, and this initialization is performed for the next module after the start-stop timer expires.

In step 570, after all of the matrix elements of TM have been calculated, the transfer matrix TM can be stored in a memory of the environmental maintenance system. The transfer matrix can be retrieved for determining whether to change an operation level of an actuator. Such determination may be performed, for example, in methods 600-900. Certain embodiments for calculating matrix elements of a transfer matrix and a LOAD matrix are now described.

Calculation of a Matrix Element

In one embodiment with one operational parameter being changed at a time, the matrix elements of one column of TM that corresponds to the changed operational parameter are determined after the second sensor values are received. If the operational parameter is $P_{indx}$ (which has a one-one correspondence with a module in this embodiment) and the sensor index is $S_{indx}$, then a matrix element $TM(S_{indx}, P_{indx})$ can be computed as:

$$TM(S_{indx}, P_{indx}) = \frac{(Y2 - Y1)}{(\Delta \text{ level})}, \quad \text{Eq. (1)}$$

where Y2 is the sensor value corresponding to $S_{indx}$ after the operational parameter $P_{indx}$ is changed, Y1 is the sensor value corresponding to $S_{indx}$ before the operational parameter $P_{indx}$ is changed, and $\Delta$level is a change in operation level of parameter $P_{indx}$. A normalization factor may also be used, e.g., if the change was not the same for each actuator. As described below, an energy factor can be included, which could be considered a normalization factor.

When the sensor values are a temperature and the modules function to cool, values of TM will typically be negative, e.g., because shutting off a module (or other decrease) should make Y2 greater than Y1, and the change in operation level ($\Delta$level) is negative. A similar result happens with starting a module (or other increase) as the temperature difference is negative, but $\Delta$level is positive. However, as mentioned above for step 540, the counter result can occur, which is counterintuitive.

TM can be normalized such that all of the matrix elements can correspond to a same units of $\Delta$level. For example, regardless of the actual change in level used to calculate a particular matrix element (e.g., 10%, 10 rpm), the matrix element can be multiplied by a factor so that every matrix element will have the same value in the denominator. Thus, in later steps a change in operation level can be used uniformly to determine a change in predicted temperature as opposed to the change in operation level being in different units for each matrix element.

In one embodiment, the $\Delta$level is a percentage of the change in the operation level, e.g., 100% for turning on to maximum capacity of the operation level, and −100% for turning off from the maximum operation level. In another embodiment, $\Delta$level is in units relative to minimum increments used to create the transfer matrix TM. For example, if the increment is 5V, 100 rpm, or other value (including percentage), then a change of 10V would be a value of 2 and 300 rpm would be a value of 3 if the transfer matrix TM was in units of the minimum increment. In another embodiment, if the transfer matrix was created in units based on a maximum level of operation across all modules (e.g. maximum power or fan setting), then $\Delta$level can be a fractional value. Each module can have a different range of operation level, e.g., one fan can have maximum speed of 2000 rpm and another 1000 rpm. In one aspect, $\Delta$level could provide normalization by itself. For instance, if the changes are always the same for a particular parameter then a normalization factor may not be needed.

In one embodiment, the operational parameter can be a percent capacity % Cap of heating/cooling flow that the module is operating. In this embodiment, $\Delta$level can correspond to % Cap when the change is shutting of the module. In one aspect, the value of % Cap can allow for a normalized measurement when all of the units are not operating at the same capacity. % Cap is an example of a current operation level.

In various embodiments, % Cap is either returned from a query of the unit, or it is calculated as follows:

$$\% \text{ Cap} = \frac{F_P(TR_P - TD_P)}{F_D(TR_D - TD_D)}, \quad \text{Eq. (2)}$$

where $F_P$ is the flow rate of the stopped module before being stopped, $TR_P$ is the return temperature of the respective module P before being stopped, $TD_P$ is the discharge temperature of the respective module P before its operation level is changed, $F_D$ is the design flow rate of the unit, and $TR_D$-$TD_D$ is the design $\Delta T$ of the respective module P.

In one embodiment, the design $\Delta T$ may be the temperature difference when a cooling valve is all the way open or open to a preferable setting. Such value may depend on the temperature of the cooling substance (e.g. water) being used, which may be included as an additional factor. In another embodiment, modules with a fixed flow fan have the same values of $F_P$ and $F_D$. In such embodiment, the % Cap returned by a module may correspond to a setting of a cooling valve (e.g. valve 320).

In modules with a variable fan, $F_D$ may be 100% of capacity or some other percent or value for which preferable (e.g. optimal) operation of the unit occurs. In one aspect, the value of $F_P$ corresponds with a setting for the speed of the fan before the stopping. In other embodiments, the heat (or cooling) flow rate FAT (design or before stopping) may be determined via other means, or simply just received from a module that measures this value.

Calculation of LOAD Matrix

In one embodiment, a LOAD matrix provides a measure of the effect of decreasing an operation level of a module on the capacity of the system. For example, the LOAD matrix can relate exactly how much the percent of capacity of a CRAC unit is increased to handle the heat load of servers of a computer room when one of the other CRAC units is turned off. In one embodiment, the number of rows and columns of LOAD equals the number of environmental maintenance modules.

The load matrix may be calculated at the same time as the transfer matrix TM. Thus, a column of TM could be calculated at a same time as a column of the LOAD matrix. In one embodiment, the load transfer function matrix (LOAD) is computed as follows:

$$\text{LOAD}(C_{indx}, K_{indx}) = \frac{\Delta \% \text{ Cap}_{Cindx,Kindx}}{\% \text{ Cap}_{Kindx}}, \quad \text{Eq. (3)}$$

wherein $\Delta\% \text{ Cap}_{Cindx,Kindx}$ is the change in percent capacity of the module $C_{indx}$ induced by stopping (or otherwise decreasing) the module $K_{indx}$, and wherein $\% \text{ Cap}_{Kindx}$ is the percent capacity of the module $K_{indx}$ prior to stopping. The value of $\text{LOAD}(C_{indx}, C_{indx})$ equals −100% by definition. In one embodiment, the value of $\text{LOAD}(C_{indx}, C_{indx})$ is not calculated or may also be set to 0 (or other default value) as this value is typically not used. The LOAD matrix may be stored in a memory of an environmental maintenance system, and then used later for determining which modules to have an operation level increased or decreased.

III. Using TM to Reduce Energy Use

The transfer matrix can be used to keep the sensors within acceptable ranges. The transfer matrix can also be used to determine operation levels that keep the sensors within acceptable ranges while using a reduced amount of energy. To determine the impact on energy, the change of operation levels is assumed to be a fixed value for each actuator (although not all the same). In this way, each of the actuators can be compared to each other, and identify which actuator affects a sensor the most. Thus, if this sensor is out of range, the actuator with the most impact can be taken as the actuator that is the most energy efficient, since the amount of energy imparted to the actuator is the most efficient.

In some embodiments, the amount of energy expended for an increase of each actuator is the same. For example, if each operational parameter of an actuator is the power level of a module and each module has the same energy efficiency, then there are no energy efficiency differences. Energy efficiency equivalence can also be assumed when differences are small.

In other embodiments, the actuators have different energy consumption. In such situations the change in sensor values (Y2-Y1) can be modulated by an energy factor. The modulated results can be compared so that energy consumption is accounted for in determining which actuators to change. For example, an actuator that uses less energy for a given change would have the modulated result increased relative to the difference in sensor values, thereby increasing the preference for having that actuator be changed. Whereas, an actuator that is less energy efficient would have the difference in sensor values reduced relatively. Such modulation for energy consumption can be included into the transfer matrix itself. The value of the modulation can be determined by changing each actuator by a same percentage and recording the energy usage. In various embodiments, the modulation can include multiplication, division, addition, and as an additional point in a coordinate system, which could involve addition, multiplication, and additional functional operations. Instead of a modulation, some embodiments can use an energy consumption value as an additional factor in determining which actuator to change. For example, the actuator that provides a suitable change in sensor values while having the smallest energy consumption can be chosen.

In one embodiment, a module's efficiency for heating/cooling flow is an example of an energy consumption factor. The efficiency may be taken as certain input settings of an actuator of a module (e.g. chilled water valve setting) or as the percent capacity from Eq. 2. In another embodiment, an efficiency η of a module $C_{indx}$ is computed as follows:

$$\eta(Cindx) = \frac{\% \text{ Cap}}{FanSpd}, \quad \text{Eq. (5)}$$

where FanSpd is the percent of full fan speed that the module is currently using. In one embodiment, the fan speed is 100% for modules that do not have a variable fan. For modules with a variable fan, the fan may be operating at less that the maximum setting, and thus at below 100%.

In one aspect, using the fan speed in the denominator can place a preference on stopping modules that do not have variable fan speeds because fan speed will be 100% in that case, and the efficiency will be less. As shown, a less efficient module has a lower efficiency since the amount of cooling capacity is less for a given fan speed. Other efficiencies can include any percent output divided by a level of input, thereby measuring efficiency. For example a cooling output for a specific chilled water valve setting can be used to compute an efficiency for the actuator of the valve.

IV. Maintaining Sensor Values in Range

Figure 6:
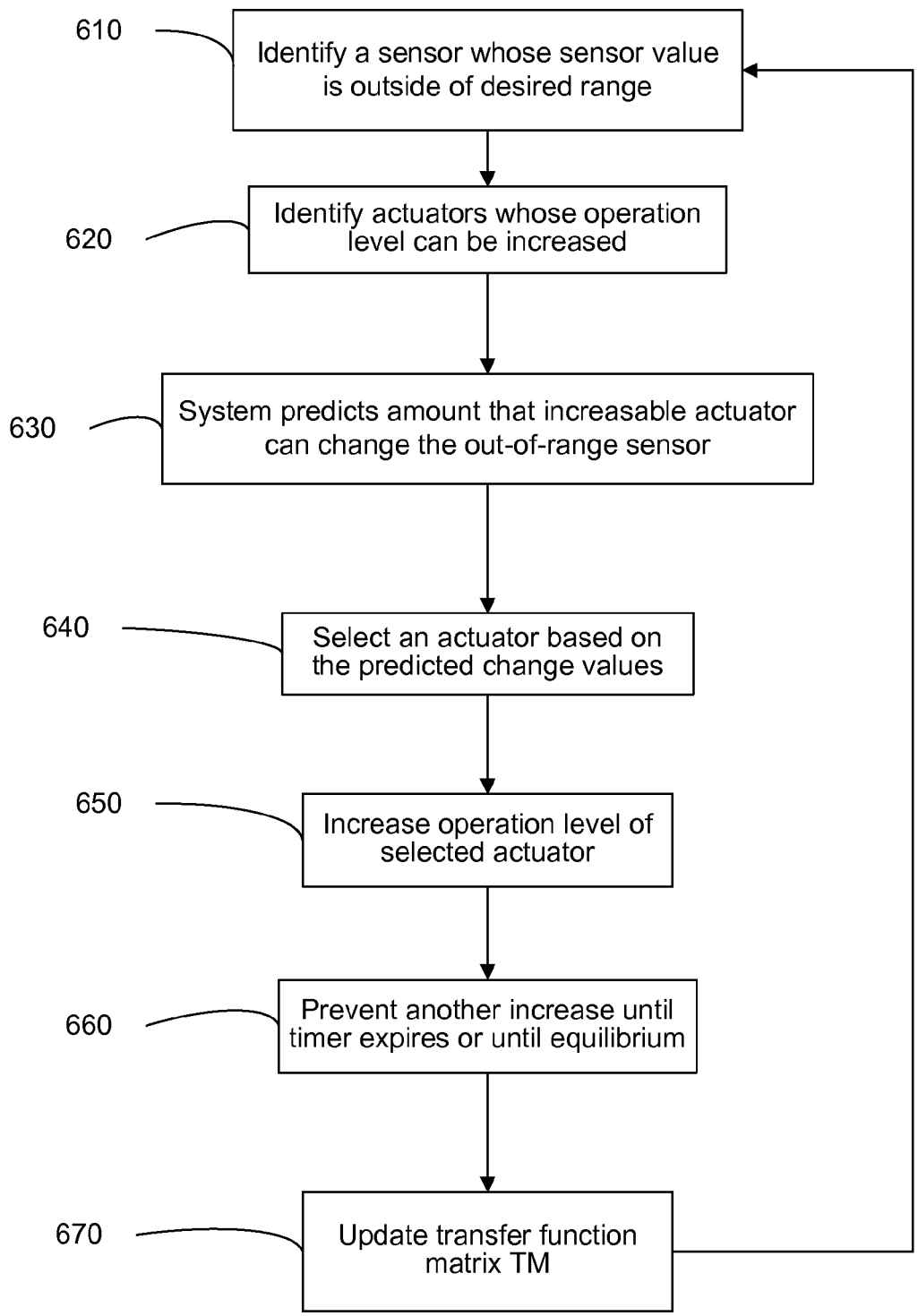
FIG. 6 is a flow diagram illustrating a method 600 of controlling an environmental maintenance system to maintain sensor values within a desired range with high efficiency according to an embodiment of the present invention.

FIG. 6 is a flow diagram illustrating a method 600 of controlling an environmental maintenance system to maintain sensor values within a desired range with high efficiency according to an embodiment of the present invention. Method 600 determines which one or more actuators are the best for changing (increasing or decreasing) operation levels when a particular sensor value has a sensor value outside of the desired range. For example, if the temperature of a sensor (e.g. a cold aisle sensor that is too hot) is beyond a threshold, method 600 can determine which modules should have an operation level increased (e.g., started) to bring the sensor back in range as quickly as possible or in an energy efficient manner. In one embodiment, the method 600 is performed in whole or in part by controller 15, or another computer or processor described herein.

In step 610, a sensor (e.g. one of sensors 3) whose sensor value is outside of the desired range is identified (e.g., a temperature is above a threshold value). In one embodiment, an application (e.g. software running on a processor of the system) can periodically check if there is a sensor value out of range. For systems that are cooling a room, such a sensor can be referred to as a hot spot since the sensor value is hotter than desired. For example, a sensor that is too hot may be identified by monitoring the sensors and having an alarm signal be sent when a sensor becomes out of range, e.g., higher than a threshold. The alarm signal may be generated internal to controller 15 or at another part of a control system.

In some embodiments, the desired range can be defined by a target value for a room. Examples of ranges include plus or minus a certain value from the target value, any value below the target value, or any value above the target value. The desired range may be web-configurable, with a default value (e.g. 83 degrees Fahrenheit for temperature of a data center). In another embodiment, a sensor may be identified as being too cold, e.g., when the environment is required to be above a particular temperature. In such an embodiment, the modules would be providing heating and not cooling.

In step 620, one or more actuators whose operation level can be increased are identified as increasable actuators. The operation level can refer to any operational parameter for an actuator of a module. Examples of when an operation level may not be increased include when an actuator is at or a near a maximum operation level. In one embodiment, the criteria for this determination can be if the operation level is within a predetermined amount (e.g. a percentage) from a maximum level. In some instances, only some of the operational parameters of a specific module can be increased, while in others all of the operational parameters may be increased. In some embodiments the increase can be restricted to modules that are stopped, thus the increase would be a start command.

In some embodiments, decreasing an actuator may actually cause a sensor to move within range, or at least closer to within range. Such instances are described above for step 540 of method 500, e.g., when transfer matrix elements have an opposite sign. In such embodiments, step 620 can be modified to also include the identification of actuators whose decrease in operation level can provide a beneficial change in the identified sensor value. Below reference is made to increasing an operation level, but decreasing an operation level may also be performed.

In step 630, the system predicts amount (change value) that an increasable actuator (i.e. identified in step 620) would change the sensor value that is out of range. This prediction can be done for each increasable actuator. The predicted change value can be estimated by using a predetermined value (e.g. 50% or 100%) for an amount that the operation level of an actuator would be increased. In one embodiment, the predicted change value predicts an extent that starting the respective stopped module would change the temperature of the sensor is determined. Thus, in an embodiment, method 600 can estimate the impact on extinguishing a hot spot by starting each stopped CRAC unit.

In some embodiments, the predetermined increase in the operation level for each actuator is the same for purposes of determining the predicted change value. In other embodiments, the predetermined increase can differ among the increasable actuators. For example, the increase can be a certain percentage (e.g. 10%, 30%, or 100%) of the increase in the operation level. The actual amount of increase actually implemented can differ from the predetermined increase used to determine the predicted change values. In one embodiment, the predetermined increase is a full amount that the operation level of the actuator (which may be equivalent to the module) can be increased. For example, as different modules may be operating at different levels before the change, each module can have a different increase. Step 620 can account for the predetermined increase and/or actual increase to ensure that the identified actuators can actually have their operational levels increased by an appropriate amount.

In one embodiment, the predicted change value $\Delta Y$ is obtained using the transfer matrix determined, e.g., as described above. One embodiment uses $Y_{post} - Y_{pre} = TM(S_{indx}, P_{indx}) * \Delta level(P_{indx})$ Eq. (6), where $Y_{post}$ is the estimated sensor value after a change, $Y_{pre}$ is the current sensor value that is out of range, $S_{indx}$ corresponds to the sensor that is out of range, and $P_{indx}$ corresponds to an actuator being considered for increasing an operational level. The predetermined increase is $\Delta level$, which may be different than the value used to create the transfer matrix TM. And, as mentioned above, $\Delta level$ may be different than an actual amount that the actuator is increased.

Accordingly, in some embodiments, $Y_{post}$ can be the estimated hot spot temperature after starting CRAC $P_{indx}$, $Y_{pre}$ can be the hot spot temperature, $S_{indx}$ can correspond to the sensor having the hot spot temperature, and $P_{indx}$ can correspond to a CRAC being considered for starting. In one embodiment, $\Delta level(P_{indx})$ is the estimated change in capacity resulting from starting a module.

Referring back to FIG. 6, in step 640, an actuator is selected for increasing based on the predicted change values. In one embodiment, the value of $Y_{post}$ is considered the predicted change value. In another embodiment, the value of $Y_{post} - Y_{pre}$ is the predicted change value. Other predicted change values using TM may also be used. The change values can be used to ensure that the sensor value will be brought within range. In one aspect, $Y_{post}$ may be chosen to be lower/higher than the maximum/minimum value defining the range by a specified amount.

For example, $Y_{post}$ or $Y_{post} - Y_{pre}$ can be used to determine which actuators can change the sensor value to be within range. The change values can also determine which actuator has the biggest change in values for the sensor $S_{indx}$. In one embodiment, the module with the largest predicted change value is used because this module will presumably cure the out of range condition with the least amount of operational change, and thus the least amount of energy. In another embodiment, the module with the largest predicted change value can also be assumed change the sensor value the fastest, and naturally change the value the most so that another out of range condition is less likely for sensor $S_{indx}$. For example, the CRAC unit that provides lowest $Y_{post}$ may be used. The change value may be a positive or a negative value. Thus, the term largest may refer to the smaller number if the value is negative. In another embodiment, any one of the units that have a predicted change value that is greater than a change threshold may be used.

As mentioned above, the transfer matrix can include energy consumption factors for each of the actuators, e.g., as described above for Eq. 4. These energy consumption factors can also be used to modify the change values, e.g., if the factors are not in the transfer matrix already. For example, a module may be selected based on a minimization of fan power consumption or other power while still having $Y_{post}$ to be within range. In one embodiment, there is a preference for starting a module that has a variable fan speed, as these modules can operate below a maximum capacity.

In step 650, the operation level of the selected actuator is increased, or possibly decreased as mentioned above. As mentioned above, in one embodiment, the application shall increase the operation level of the actuator that has the biggest impact on extinguishing the hot spot (e.g. starting the CRAC unit that produces the lowest estimated temperature at the hot spot). More than one actuator or module can be increased if the estimated $Y_{post}$ with the actual change $\Delta level(P_{indx})$ is below a target value. In one embodiment, if none of the $Y_{post}$ values exceed a target value (or minus a deadband), then two actuators may be increased at the same time. The deadband can ensure that a sufficient change beyond an edge of the desired range is achieved.

As mentioned above, the operational parameter whose level is being increased can be an output parameter, e.g., the percent capacity mentioned above. A problem of using an output level can be that one may not be able to predict exactly what the output level is for a given input, particularly given that the output level may depend on the operation of other modules and actuators. Accordingly, it can be difficult to predict the exact change in operation level that will be achieved. In some embodiments, the change in operation level is estimated from the existing operation levels.

Some embodiments can estimate how that cold air is redistributed after the increase. A uniform redistribution can result in the default value of the average output levels of the operating modules times $N/(N+1)$ where N is the number of operating units before increasing the new module for the actual output level. The average may be obtained from each module, or be assumed to be the same for all modules, and thus only one output level may be determined. In another embodiment, the output level may be determined from the LOAD matrix described above (equation 3), or a similar LOAD matrix that is created by increasing a module and measuring the changed capacity. The actual capacity may be differ from the actual capacity, but this estimated value can help determine if more than one module needs to be increased.

In step 660, other actuators are prevented from being increased, e.g., for a certain period of time or based on a criteria (e.g. a quasi-steady state condition as described above for method 500). In one embodiment, a timer is started after the selected one or more actuators are increased. In one aspect, the timer is a web-configurable timer (default 15 minutes) that shall prevent another increase until the timer expires. In another embodiment, a module can be prevented from increasing until the sensors values have reached an equilibrium in response to increasing an actuator. In one aspect, this prevents too many actuators from increasing at similar times, and thus using more units than are required, which might use too much energy.

In step 670, the transfer function matrix TM is updated. For example, the values of TM for the increased actuator (e.g. a started module) may be updated using equation 1. In this manner, one can determine how accurate the initialization was or adapt to changes in the load whose temperature is being maintained, and TM can be refined in response. Accordingly, this updating can handle a changing relationship in the transfer matrix. In this way, the system would change along with changing variables of the system, and thus may continue to provide accurate estimations.

In some embodiments, the first step of the update can be to record sensor values before any operation level is increased, as well as the operation level (e.g. percent capacity) of the selected actuators (which can include identifying the actuator to be off). A next step of the update can be to record the sensor values after a set time period or after the criteria is met, as well as the operation level of the actuators that have been increased. In one embodiment, the new matrix elements of TM in Equation 1 are calculated for the column(s) j corresponding to the actuators that are changed. The updated TM is then obtained as follows: $TM(i, j)_{updated} = g*TM(i, j)_{new} + (1-g)*TM(i, j)_{old}$ Eq. 7, where g is between 0 and 1 (e.g. a default of 0.3). In one embodiment, the value of g could vary with time or depend on another variable. In other embodiments, other older TM matrices (i.e. matrix elements from previous updates, such as $TM_{older}$) may be used to obtain the $TM_{updated}$.

In one embodiment, the operation levels of each of the actuators are measured and each of the columns are updated. Thus each of the rows would have the same change in sensor values, but the change in operation levels would vary. These other matrix elements can be computed when the operation level is an output level, which may change even though the input to only one actuator is changed.

In other embodiments, an aisle sensor (or other sensor) that is too cold may also be used to identify a cold spot. The above method may be used to turn on an HVAC unit that provides heating, e.g., when the system is attempting to heat an environment relative to an ambient temperature instead of cooling it as described above. In embodiments where the system is to be cooled, the sensing of a cold spot may trigger a stopping of one of the HVAC units. Such preventing of cold spots can help as low temperatures have been shown to be associated with premature disk drive failures. The stopping of a module may occur for other reasons as well.

Method 600 may repeat. For example, a check may be performed periodically to determine if any sensor is out of range. In one embodiment, the amount of increase can be at least a predetermined amount (which may be less than 100%). If the increase is less than full, on the next round, the same one or more actuators can be chosen.

In some embodiments, a preference may be made for starting or stopping an actuator (potentially a whole module) as opposed to just increasing or decreasing by an intermediate value. In one embodiment, if turning on an actuator does not bring the sensor value back in range then other actuators that are currently running may be analyzed. In another embodiment, the preference is only performed when there is a mix of that can only be turned on or off, while the other actuators have other intermediate settings. These embodiments can be applied to other mentioned described herein. Two different transfer matrices can be used: one for determining whether to start or stop; and the other for determining whether to do a variable increase or decrease, which may be less than 100%.

Selecting Parameter to Change Using Randomness

If the operational parameter (e.g. power to a module) that provides the largest change value is always chosen, then certain parameters will always be changed. For example, changing the same actuator often may cause that transfer matrix to incorrectly weight that actuator, and thus cause a selection of that same actuator more in the future. To remove the bias, some embodiments select another actuator at random. The selection may still be restricted to actuators that still bring the sensor value within range. The randomness can prevent any particular patterns in the increasing of actuators, which would reflect biases and not a natural function of the system.

In one embodiment, the selection randomly chooses to a second optimal actuator. The total percentage that the sub-optimal actuator is chosen can be selected (e.g. 20% of the time), but the exact times for the sub-optimal selection may be random. In another embodiment, each actuator that is predicted to bring the sensor value back in range is allowed to be picked during a random selection.

Energy Savings vs. Reliability

As mentioned above, sometimes decreasing an actuator can bring about a desired change in an out of range sensor value. Sometimes the change may not be sufficient to cause the sensor value to be back in range, but the change is still in the desired direction. For example, in cooling a data center, stopping a module can actually cause a temperature of a sensor to decrease.

In some embodiments, it is more desirable to save energy, than to have the sensor values back in range as quickly as possible. Thus, there can be a preference for decreasing an actuator than for increasing an actuator. In one embodiment, such a preference can be made among all actuator changes that can bring the sensor back in range. In another embodiment, such a preference can be made for a decrease even if the change does not bring the sensor back in range, as long as the change is toward the desired range. For example, if the range is less than 83° and the hot spot temperature is 87°, then a predicted change of an actuator to change the temperature to 85° would be acceptable for choosing to decrease the actuator. In one embodiment, the decrease is always stopping the actuator.

V. Saving Energy by Decreasing an Operation Level

When all of the sensors are within range, operation of the actuators can be decreased to save energy. Such decreased operation can be controlled to prevent an out-of-range condition for the sensor values. For example, as predicted change values were used above to determine which actuators will bring sensor values back into range, predicted change values can be used to determine which actuators will not cause an out of range condition.

Figure 7:
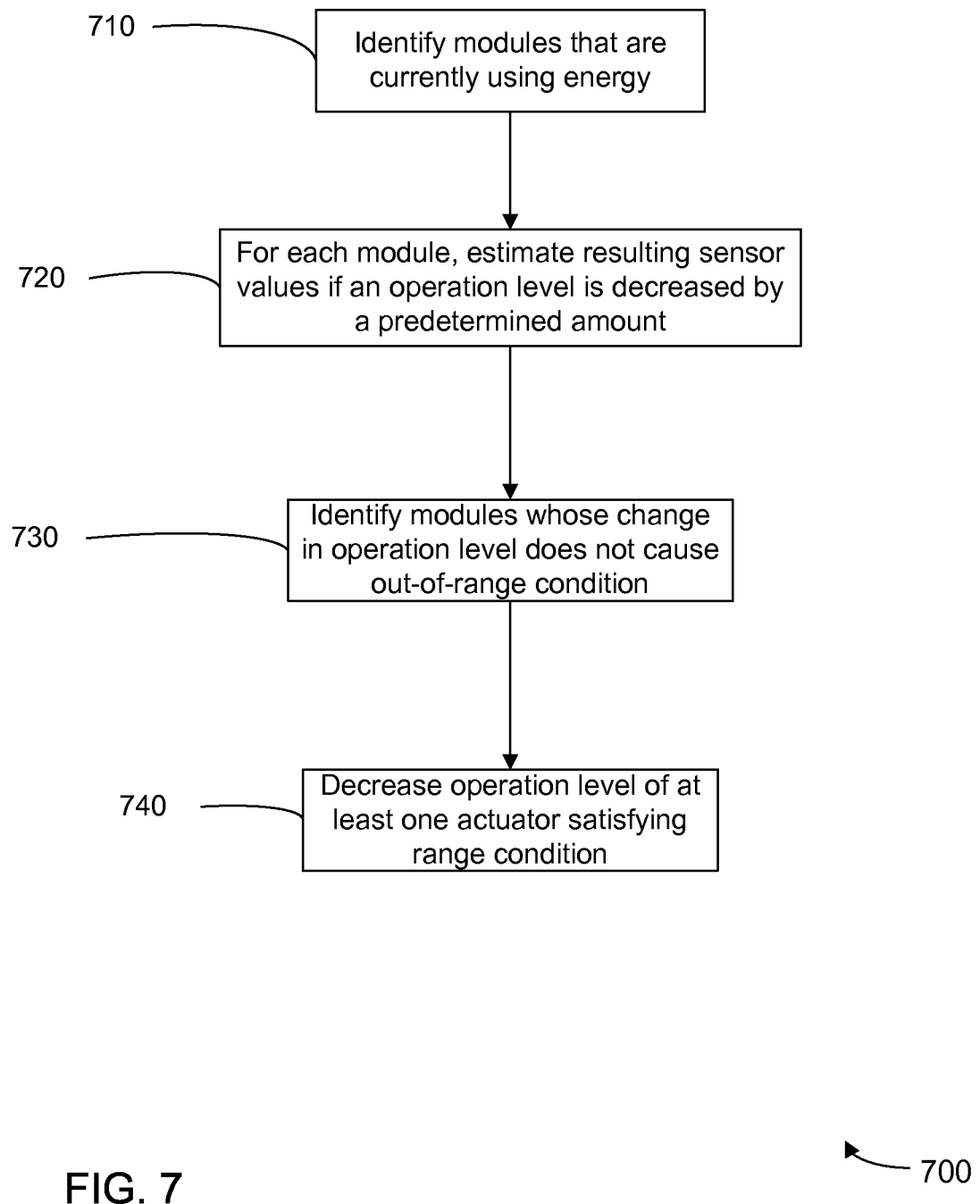
FIG. 7 is a flow diagram illustrating a method 700 of controlling an environmental maintenance system by decreasing operation of actuators according to an embodiment of the present invention.

FIG. 7 is a flow diagram illustrating a method 700 of controlling an environmental maintenance system by decreasing operation of actuators according to an embodiment of the present invention. Method 700 determines which actuators are acceptable to decrease. In one embodiment, the method 700 and other methods mentioned herein are performed wholly or partially by controller 15, or another processor described herein.

In step 710, actuators that are currently using energy (i.e. running) are identified. In various embodiments, the energy use may be electrical (e.g. power to a fan), thermal such as providing heating/cooling (e.g. supplying cold water to a cooling element), or combustible (e.g. burning gas to provide heat). In one embodiment, the identified actuators are also limited to the actuators that are available for decreasing. For example, if the power to a module is only operational parameter to be decreased, the module is viewed as a single actuator.

In step 720, the system estimates the resulting sensor values if an operation level of a running module were decreased by at least a predetermined amount (e.g. 50% or 100%). Resulting sensor values can be determined for each running module. The operation level corresponds to an actuator of a module, which can be considered the module itself As there can be more than one actuator for a module, resulting sensor values can be determined for a predetermined amount of change for each actuator. In one embodiment, the following equation is used to determine the change in sensor value for a predetermined change $\Delta$level for parameter $P_{indx}$:
$Y_{post} = Y_{pre} + TM(S_{indx}, P_{indx})*\Delta level(P_{indx})$ Eq. 8.

In step 730, a first set of one or more of the plurality of the modules currently running that have none of the estimated sensor values outside of a first range is determined. For example, in one embodiment, if turning off a module will not cause an out-of-range condition, then that module would be part of the first set. In another embodiment, if decreasing one or more actuators of a module would not cause an out-of-range condition, then hat module would be part of the first set. As described herein, each sensor can have a different range, and the term first range encompasses these different ranges. The range can include thresholds and a deadband value as described herein.

In step 740, an operation level of at least one module of the first set is decreased in response to the determination that one or more of the plurality of the modules currently running have none of the estimated sensor values outside of the first range. In one embodiment, the operation level may be an operation level for the whole module, e.g., turning off the module. In another embodiment, more than one operation level of an actuator may be decreased for a module. In yet another embodiment, various actuators for multiple modules may be decreased. In an embodiment, the combined effect of decreasing multiple actuators may be achieved by assuming linearity and simply summing the changes resulting from the decreases.

In some embodiments, the first set of modules that might have an operation level decreased is also restricted to modules that that have an efficiency (e.g. as computed from Eq. 5) less than a threshold (e.g. 40%). In one embodiment, the actuator with the lowest efficiency is decreased. In another embodiment, an operation level is not decreased if the load on the system after the decrease would be above a threshold. In one implementation, the load can be calculated using the LOAD matrix of Eq. 3.

The estimated percent capacity % $\overline{C}$ap of module $C_{indx}$ of each running module can be calculated as % $\overline{C}$ap($C_{indx}$)=% Cap($C_{indx}$)+LOAD($C_{indx}$,$K_{indx}$)*% Cap($K_{indx}$)  Eq. 9, wherein the load matrix provides a measure of the effect of decreasing an operation level on the capacity of use of the other actuators. The load matrix element LOAD ($C_{indx}$, $K_{indx}$) provides a measure of the effect of stopping module $K_{indx}$ on the capacity of module $C_{indx}$. The estimated percent capacities can be summed or otherwise combined to determine a total load. % Cap(Sindx) is the CRAC unit that is going to be stopped and % Cap(Cindx) is for the CRAC unit whose efficiency is being determined. The overbar for % $\overline{C}$ap(Cindx) denotes that the value is an estimate.

In one embodiment, decreasing the operation level of another module is prevented until a predetermined amount of time expires after decreasing the at least one module of the first set. In another embodiment, the transfer matrix elements can be updated in a similar manner as described above. For example, sensor values before and after the decrease can be used as well as the change in operation level of one or more actuators.

VI. Stopping a Module

Figure 8:
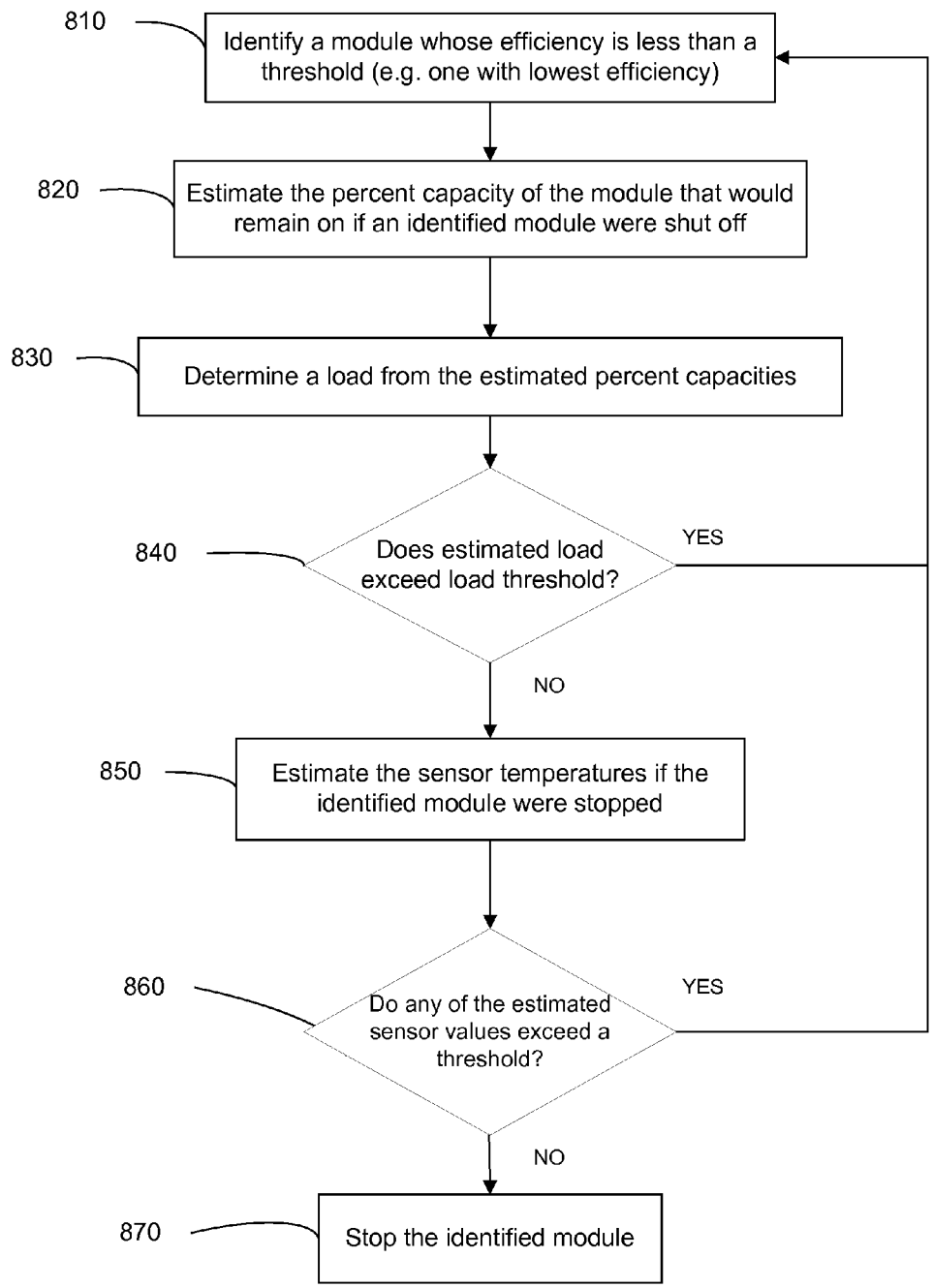
FIG. 8 is a flow diagram illustrating a method 800 of controlling an environmental maintenance system including a plurality of modules and sensors by stopping modules according to an embodiment of the present invention.

As mentioned above, the process of identifying a module to decrease an operation level of an operational parameter can result in stopping the module completely. FIG. 8 is a flow diagram illustrating a method 800 of controlling an environmental maintenance system by stopping modules including a plurality of modules and sensors according to an embodiment of the present invention. Method 800 can determine which module is the best one to stop. Specifically, method 800 describes an example where the system can provide cooling and the sensors are temperature sensors.

In step 810, a module whose efficiency is less than a threshold is identified. In one embodiment, the threshold is web-configurable (e.g. default is 40%). The efficiency can be measured using Eq. 5 or using other methods described herein. In one embodiment, method 800 can first find the module with the smallest value of efficiency on the first iteration. In this manner, the unit that is doing the least amount of cooling (or heating depending on the embodiment) will be targeted for possibly shutting off. In other embodiments, more than one module may be identified per iteration.

In step 820, the percent capacity of each module that would remain on if the identified module were shut off is estimated. In one embodiment, the application shall estimate the percent capacity of each CRAC unit that would remain on if the target unit were shut off using Eq. 9.

In step 830, an energy load is determined from the percent capacities. In one embodiment, the energy load is expressed as an average percent capacity of the system. In another embodiment, the heat load is the total energy load of the system, e.g., as determined by summing terms of the percent capacities multiplied by the respective capacity of a unit. In another embodiment, the energy load corresponds to the largest percent capacity of a module.

In step 840, it is determined whether the estimated energy load exceeds a load threshold. If the estimated energy load does not exceed the load threshold, then the method proceeds. If the estimated energy load does exceed the load threshold, then the method returns to step 810 to identify another module for possibly stopping. This determination helps to prevent the system form being overloaded by the stopping of a module.

In one example, if shutting off the target module would not cause the energy load to exceed a target percent of the capacity that would remain on after a unit is shut off (default=90%), then that module is shut off. In one embodiment, if shutting off the least efficient module would overload the modules that remain on or cause an out-of-range condition (e.g. a hot spot), then the next lowest efficient module shall be evaluated for stopping.

In an embodiment where the energy load is the largest percent capacity of a module, the efficiency threshold may be larger than that used for the total capacity (e.g. 95%). Both types of thresholds may also be used.

In step 850, the sensor temperatures if the identified module were stopped are estimated. In one embodiment, the application estimates the cold aisle temperatures if the target CRAC unit were shut off using Eq. 8.

In step 860, it is determined whether any of the estimated sensor values exceed a threshold, i.e. are outside of a range. This step helps to prevent creating a hotspot. If the estimated sensor values do not exceed the threshold, then the method proceeds. If the estimated sensor values do exceed the threshold, then the method returns to step 810 to identify another module.

In one example, if shutting off the target module would not cause any sensor values to exceed the threshold minus a deadband (e.g. 83 degrees F. minus 2 degrees F.), then the target module can be stopped. The use of the deadband can ensure that the sensor will not get close to the threshold.

In one embodiment, the target temperature (or other sensor value) used to determine a hot spot is the same target temperature used to determine whether a sensor temperature exceeds a target threshold minus a deadband.

In step 870, the identified module is stopped. In one embodiment, after stopping the identified module, a start-stop timer, e.g., with a web-configurable limit (default 15 minutes) shall be started, and another CRAC unit shall not be stopped until the start-stop timer expires.

Also, the values of TM corresponding to the target CRAC unit may be updated as described above after the start-stop timer expires. In one aspect, the first step of the update is to record the cold aisle temperatures and percent capacities of the CRAC units that are on, including the one being stopped, before the start-stop timer is restarted. The second step of the update is to record the cold aisle temperatures and percent capacities after the start-stop timer expires. The values of TM in Equations 1 and 2 are then computed and updated, e.g., according to Equation 5.

VII. Starting and Stopping

In some embodiments, a control system can keep track of which actuators should be changed (increase or decrease) to efficiently maintain sensor values within the desired range, and at different times track which actuators can be decreased to save energy without causing an out of range condition. In one embodiment, the logic for maintaining sensor values within range trumps the logic for decreasing energy use. For example, if there is a CRAC with a low efficiency and a there is a hot spot at the same time, then a CRAC will be started, not stopped.

Figure 9:
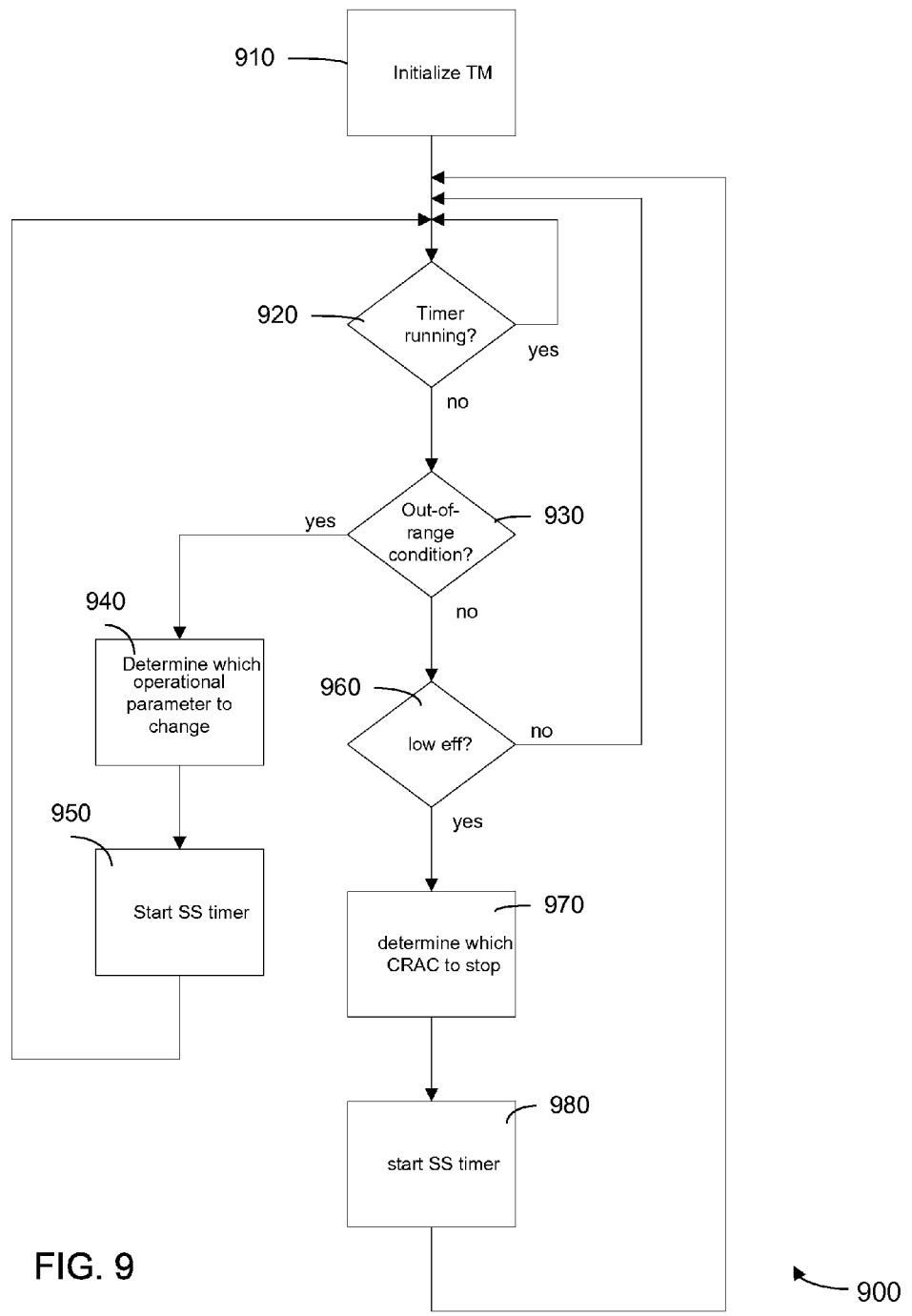
FIG. 9 is a flow diagram illustrating a method 900 of controlling an environmental maintenance system by starting and stopping modules including a plurality of modules and sensors according to an embodiment of the present invention.

FIG. 9 is a flow diagram illustrating a method 900 of controlling an environmental maintenance system by increasing or decreasing operation levels of modules to maintain sensor values within a desired range and reduce energy use according to an embodiment of the present invention. Method 900 can determine which actuator is best to increase or decrease based on different conditions.

In step 910, the transfer matrix TM (see Eq. 1) and potentially the LOAD matrix (Eq. 3) are initialized. In one embodiment, the transfer matrix TM is initialized using method 500. In other embodiments, the transfer matrix TM may be received by a control system when default values are assumed or when initialization is performed by another control system.

In step 920, it is determined whether a change in an operation level of an actuator is prevented. As mentioned herein for various embodiments, the prevention may be determined by a timer or by criteria, e.g., whether a quasi-steady state condition has been achieved in the sensor values. As an example, if the timer has not expired, then the process takes the "yes" branch and waits until is acceptable to start or stop a module, or other change an operation level of an actuator of a module. If the timer has expired then the process continues along the "no" branch. The determination of prevention of a change can be made periodically at a relatively high frequency, such as every 10 or 30 seconds.

In step 930, the sensor values are monitored to determined whether an out-of-range condition is present. In one embodiment, temperatures (e.g. the cold aisle temperatures near the servers) are monitored to determine whether a hot spot (or other violation of a threshold) is occurring. If an out-of-range condition is present, the process moves to step 940. If an out-of-range condition is not present, the process moves to step 960.

In one embodiment, the sensor values can be monitored even though a change in operation level is prevented. In this manner, once the prevention is lifted, the process can move forward with handling an out-of-range condition that has occurred when the prevention was in place.

In step 940, a control system can determine which operational parameter(s) to change to bring the sensor values back into range. Such a determination can be made by any of the embodiments of method 600. In one embodiment, the operational parameter is whether to start or stop a module. In another embodiment, the operational parameter may be an operation level of one or more actuators.

In step 950, a timer is started to prevent other operation levels from being changed until the timer expires and/or until a quasi-steady state condition is achieved, as may also be done for other steps of other methods mentioned herein. The TM and/or LOAD matrices may be updated when the timer expires.

Returning to the branch if no out-of-range condition is present, in step 960, it is determined whether any of the actuators (potentially including a whole module) have an efficiency that is below an efficiency threshold. The efficiency may be determined by any of the methods mentioned herein. In one embodiment, if no module is operating below the energy threshold, then the process returns to step 920. In another embodiment, the process may continue even if no module is operating with an efficiency below the threshold.

In step 970, it is determined whether an actuator can have its operation level decreased (e.g. stopped) without causing an out-of-range condition. The prediction of whether an out-of-range condition will occur can be performed as mentioned herein. For example, such determination may be made by any of the embodiments of method 700. In one embodiment, the module with the highest capacity that still does not cause an out-of-range condition is decreased (e.g. stopped).

In step 980, a timer is started to prevent other units from being changed until the timer expires and/or until a quasi-steady state condition is achieved. The TM and/or LOAD matrices may be updated when the timer expires.

VIII. Calculation Multiple Columns of TM at Same Time

In one embodiment, the transfer matrix elements of one column at a time may be calculated. For example, only one operational parameter (i.e. operation level of an actuator) may be varied, with the change in sensor values being used to updated a column of the transfer matrix TM corresponding to the changed parameter. Such an embodiment allows one to isolate the interaction between an operation level and the sensor values. However, such a process can be slow as every actuator must be decreased and then increased to obtain the matrix elements (Note that the TM may be updated after the decrease and the increase). To make the initialization more efficient, some embodiments can change multiple operation levels at the same time, and thus calculate matrix elements for multiple columns.

In some embodiments, multiple columns are determined at a time. In one embodiment, each parameter is changed more than once, and an average (e.g. a weighted average) of a matrix element from each change is used to determine a new matrix element. The process for a single operational parameter can include turning off (or some other decrease) an actuator, calculating a matrix element, turning on the actuator, and again calculating the matrix element, with an average of the two calculated matrix elements being determined. At each point of change of an actuator in the above example, multiple actuators can be changed at the same time. In some embodiments, the matrix elements are updated using a recursive least squares with covariance resetting to update the elements of the transfer matrix.

In one embodiment, each element of the transfer matrix is the steady-state change in a process variable (e.g., inlet air temperature) divided by a steady-state change in a control action, also called a change in operation level (e.g., starting and stopping a cooling unit). If the transfer matrix is arranged so that rows correspond to sensor values and columns correspond to control actions, then an element of the transfer matrix is defined as follows:

$$TM(i, j) = \frac{Y(i)_{after} - Y(i)_{before}}{u(j)_{after} - u(j)_{before}} = \frac{dY(i)}{du(j)}, \quad \text{Eq. (10)}$$

where Y is a vector of process outputs (e.g., server inlet air temperature, pressure, humidity, etc) and where u is a vector of control commands, or potentially an output level. When the control commands are on/off, u takes values of 1 (on) or 0 (off).

In addition to the transfer matrix, an embodiment can use a covariance matrix. In one embodiment, the covariance matrix is a square matrix the size of the number of control actions (i.e., it has the same number of rows and columns as the number of elements of u). The initial covariance matrix can be an identity matrix multiplied by a large number (e.g., 1e6). In one aspect, the covariance matrix can describe the uncertainty in the estimated values of the transfer matrix corresponding to the sensor. For example, the covariance matrix can provide the uncertainty in the transfer matrix vector of parameters that corresponds to a particular sensor. In an embodiment, changing the operation level of one actuator more than another can reduce the elements of the covariance matrix corresponding to that actuator because there will be more information about how that actuator affects sensors.

In one embodiment, initialization of the transfer matrix TM can be performed according to the following method. Some of the following steps may be optional.

In step 1, a covariance matrix P is set to a diagonal matrix with diagonal entries equal to $10^6$. In step 2, the transfer matrix values TM are set to zero. In step 3, all actuators (which may be equivalent to an entire module) are turned to 100% or some other common value. In step 4, the "before" temperatures are recorded. In step 5, a first actuator is turned down or off In step 6, the initialization waits until a configurable timer times out (e.g. with a default of 15 minutes), a quasi-steady state condition is reached, or a cold aisle temperature exceeds a limit (e.g. with a default of 87 degrees F.). In step 7, the "after" temperatures are recorded. In step 8, the temperature changes dY are computed.

In step 9, a learning update is performed. In one embodiment, a learning vector L is computed as L=P*du/(λ+ $du^T$*P*du) (Eq. 11) and the covariance matrix is updated using P=(I−L*$du^T$)*P/λ (Eq. 12), where du is the vector of changes in the input control commands (or alternatively a change in an output level), and I is an identity matrix, and λ is a forgetting factor. In one aspect, λ can be "1" during initialization. The matrix can be made to be symmetric, e.g., by setting the below-diagonal elements to the above diagonal elements.

The transfer matrix can also be computed by computing prediction errors and then updating the rows of TM, which may be done for all columns or just the columns corresponding to the actuators that have been changed. In one embodiment, the error for sensor $S_{indx}$ is e=dY($S_{indx}$)−TM($S_{indx}$,:)*du, and the new TM matrix elements are TM(sindx,:)=TM(sindx,:)+(L*e) across all columns or just the columns for the actuators that have changed.

In step 10, the first actuator is turned back to the previous level, and the second actuator is turned off or down. In step 11, a time is waited, e.g., as in step 6. In step 12, the "after" temperatures are recorded. In step 13, the temperature changes dY are computed. In step 14, a learning update is performed, e.g., as described above in Step 9. In step 15, the next actuator is turned back to its previous level, and the next actuator is turned down of off.

In step 16, the process can then go to step 11 for subsequent units until they have all been cycled up/down or on/off. The last actuator may be cycled up/on by itself, just as the first actuator was initially cycled down/off by itself. In step 17, the trace of the final covariance matrix can be stored as $Tr_{final}$. In some embodiments, more than just one actuator is cycled up at a time, and more than one actuator is cycled down at a time.

A similar or same process can be implemented for updating the matrix elements while the system is controlling the environment. Such a process can be performed when any change is performed on an actuator, e.g., as described above for methods 500-900.

In step 101, it is determined which actuator(s) to change. In step 102, the "before" temperatures are recorded. In step 103, the operation level of the actuator(s) is changed. In step 104, a time is waited, e.g., as in step 6 of the above method. In step 105, the "after" temperatures are recorded. In step 106, the temperature changes (dY) are computed.

In step 107, the change in operation level (du) is computed. In step 108, a learning update is performed, e.g., as described above in Step 9, where λ can equal 1.0. In step 109, the vector of prediction errors is computed as E=dY−TM*du. In step 110, the mean absolute prediction error $|E|_1$ and the maximum absolute prediction error $|E|_\infty$ are computed. In step 111, the size of the prediction error as the weighted average $|E|_1$ and $|E|_\infty$ is computed as $\|E\|=w*|E|_1+(1-w)*|E|_\infty$.

Figure 10:
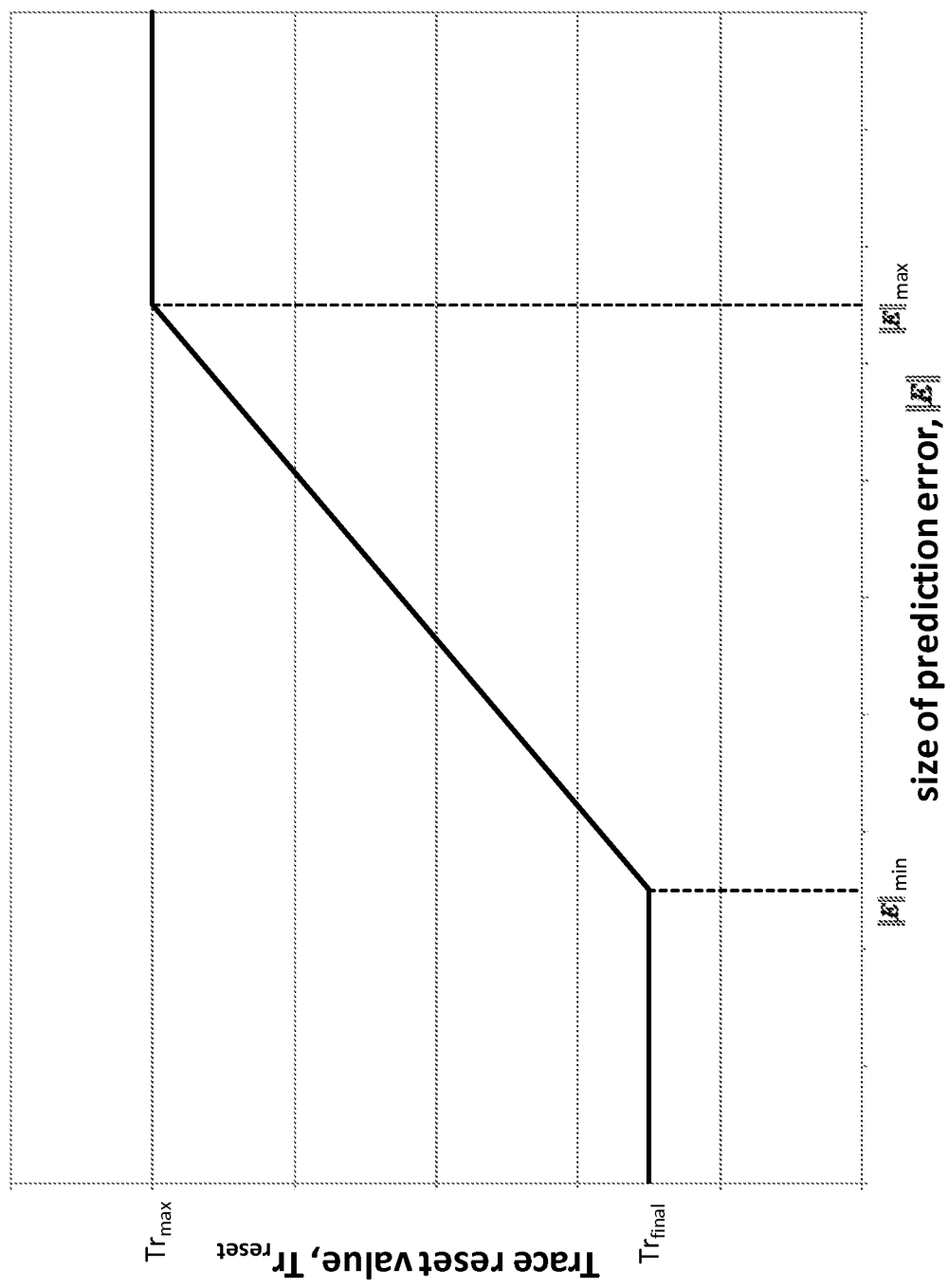
FIG. 10 is a plot showing an equation for updating the trace of the covariance matrix based on a size of a prediction error.

In step 112, a reset value for the trace of the covariance matrix is determined from an equation that links the size of prediction error to the reset value of the trace. FIG. 10 provides an example of such an equation. In step 113, the trace can be updated by scaling each of the existing values by a same multiplier such that the trace equals the reset value. In one embodiment, the covariance matrix is reset so that its trace equals the trace reset value as follows: P=P*$Tr_{reset}$/trace (P). In step 114, the process repeats to step 101.

Figure 11:
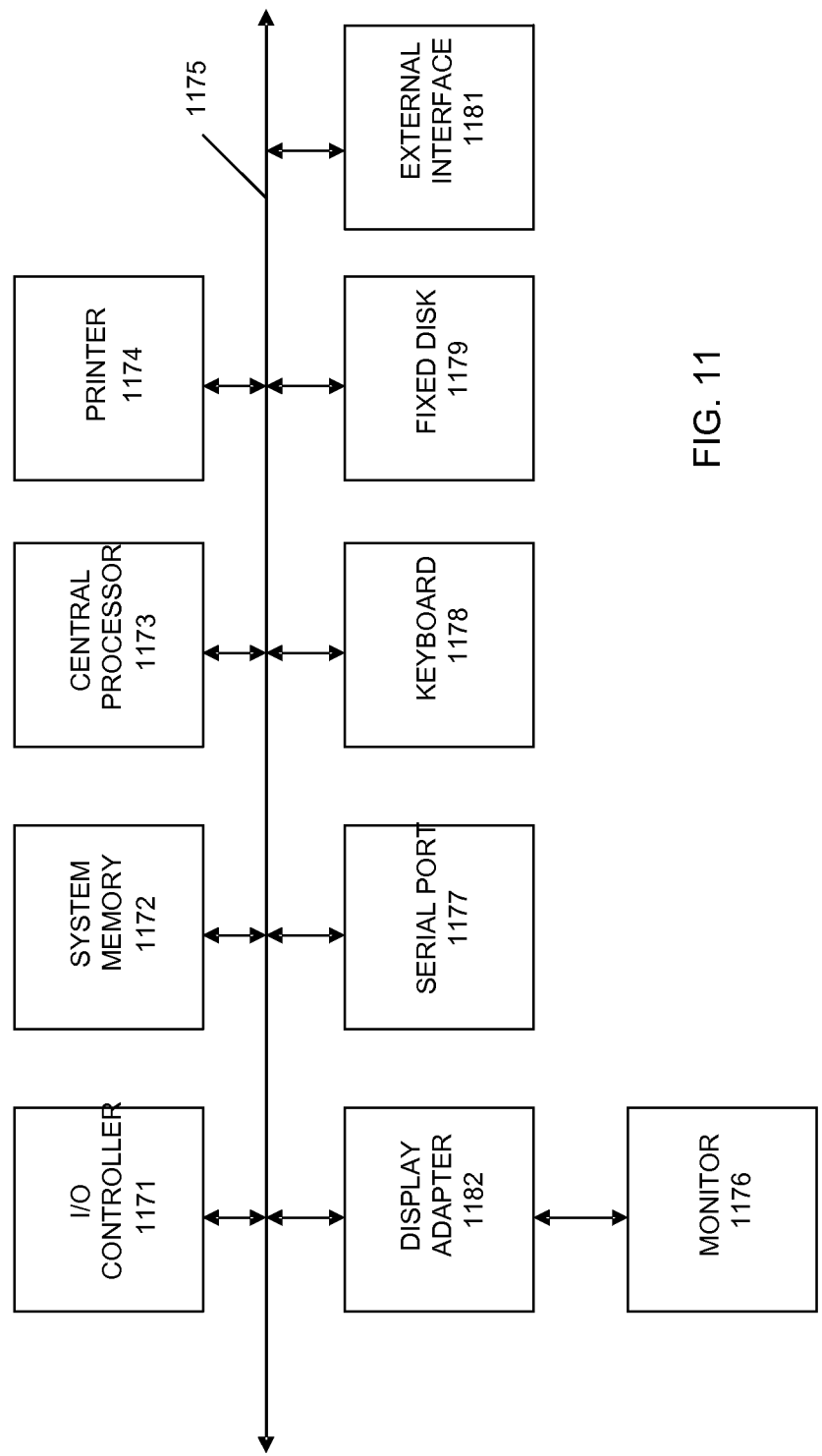
FIG. 11 shows a block diagram of an exemplary computer apparatus usable with system and methods according to embodiments of the present invention.

Any of the control systems, computers, or controllers may utilize any suitable number of subsystems. Examples of such subsystems or components are shown in FIG. 11. The subsystems shown in FIG. 11 are interconnected via a system bus 1175. Additional subsystems such as a printer 1174, keyboard 1178, fixed disk 1179, monitor 1176, which is coupled to display adapter 1182, and others are shown. Peripherals and input/output (I/O) devices, which couple to I/O controller 1171, can be connected to the computer system by any number of means known in the art, such as serial port 1177. For example, serial port 1177 or external interface 1181 can be used to connect the computer apparatus to a wide area network such as the Internet, a mouse input device, or a scanner. The interconnection via system bus allows the central processor 1173 to communicate with each subsystem and to control the execution of instructions from system memory 1172 or the fixed disk 1179, as well as the exchange of information between subsystems. The system memory 1172 and/or the fixed disk 1179 may embody a computer readable medium.

It should be apparent that various different modifications can be made to embodiments without departing from the scope and spirit of this disclosure.

The specific details of the specific aspects of the present invention may be combined in any suitable manner without departing from the spirit and scope of embodiments of the invention. However, other embodiments of the invention may be directed to specific embodiments relating to each individual aspects, or specific combinations of these individual aspects.

It should be understood that the present invention as described above can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described in this application, may be implemented as software code to be executed by a processor using any suitable computer language such as, for example, Java, C++ or Perl using, for example, conventional or object-oriented techniques. Computer programs incorporating features of the present invention may be encoded on various computer readable media for storage and/or transmission; suitable media include magnetic disk or tape, optical storage media such as compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium according to an embodiment of the present invention may be created using a data signal encoded with such programs. Computer readable media encoded with the program code may be packaged with a compatible device or provided separately from other devices (e.g., via Internet download). Any such computer readable medium may reside on or within a single computer program product (e.g. a hard drive or an entire computer system), and may be present on or within different computer program products within a system or network.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of controlling an environmental maintenance system including a plurality of environmental maintenance modules and a plurality of sensors that measure a value of a physical condition of an environment, the method comprising:
    identifying a sensor $S_{indx}$ whose sensor value is measured to be outside of a range;
    for each of a plurality of the modules:
        identifying a change in value of an operation level for the module,
        using the change in value of the operation level as an input to a transfer function, and
        obtaining a respective predicted change in the sensor value of the sensor $S_{indx}$ as an output of the transfer function, the respective predicted change in the sensor value corresponding to the identified change in the operation level for the module;
    selecting at least one module based on the respective predicted change in the sensor value, wherein the respective predicted change in the sensor value of the selected at least one module satisfies a criterion; and
    changing the operation level of the selected at least one module to effectuate a change of the sensor value of sensor $S_{indx}$.

2. The method of claim 1, wherein the change of operation level is starting or stopping the module.

3. The method of claim 1, wherein obtaining the predicted change in the sensor value for a first module includes determining a predicted change in the sensor value for a change in operation level of each of a plurality of actuators corresponding to the first module.

4. The method of claim 1, wherein the change of operation level is increasing an operation level of the selected module, wherein the selected module was previously running before the change, and wherein the measured sensor value is outside of a range when the measured sensor value is above a threshold value or below a threshold value.

5. The method of claim 1, wherein the module with the largest predicted change value has its operation level changed.

6. The method of claim 1, wherein selecting a module includes:
    identifying the predicted change values that are greater than a change threshold; and
    selecting one of the modules whose predicted change value is greater than the change threshold.

7. The method of claim 6, wherein if at least one of the modules has a predicted change value greater than the change threshold and has a variable fan speed, then a module with a variable fan speed is selected for changing the operation level.

8. The method of claim 6, wherein selecting one of the modules is performed randomly.

9. The method of claim 1, wherein the respective predicted change in the sensor value of the sensor $S_{indx}$ obtained as the output of the transfer function corresponds to $Y_{post}-Y_{pre}$, which is determined as $Y_{post}-Y_{pre}=TM(S_{indx},P_{indx})*\Delta level_{est}(P_{indx})$ where $Y_{post}$ is the estimated sensor value of the identified sensor $S_{indx}$ after changing the operation level of module $P_{indx}$, $Y_{pre}$ is the sensor value of the identified sensor $S_{indx}$ before changing the operation level of module $P_{indx}$, $\Delta level_{est}(P_{indx})$ is an estimated amount of change in the operation level of the module $P_{indx}$ to be enacted, and wherein TM is a transfer matrix that provides a relation between changing an operation level of a module and resulting changes in sensor values.

10. The method of claim 9, wherein the change of the operation level of module $P_{indx}$ is a start, wherein N modules are running prior to module $S_{indx}$ being started, and wherein the estimated operation level of the module $P_{indx}$ after starting is an average of the operation levels of the operating modules times $N/(N+1)$.

11. The method of claim 9, further comprising updating the transfer matrix TM by:
    measuring first sensor values Y1 of the sensors and determining the operation level of the selected at least one module before changing at least one operation level;
    after changing the at least one operation level of the selected at least one module, measuring second sensor values Y2 of the sensors and determining the operation level of the selected at least one module;
    calculating $$TM_{NEW}(T_{indx}, S_{indx}) = \frac{(T2-T1)}{(\Delta\ level)}$$

for the selected module $P_{indx}$ for each of the sensors, wherein Y1 and Y2 are the measured first and second sensor values for the sensor $S_{indx}$, and wherein $\Delta level$ is a measure of the change in operation level of the selected module $P_{indx}$; and
    using $TM_{NEW}$ to determine the updated value for TM.

12. The method of claim 11, wherein the updated TM is obtained from $TM_{NEW}$ and the old TM using the equation $$TM(i,j)_{updated} = g*TM(i,j)_{new} + (1-g)*TM(i,j)_{old},$$

where g is between 0 and 1.

13. The method of claim 1, further comprising preventing changing an operation level of another module until a predetermined amount of time elapses after the selected module has its operation level changed or until a quasi-steady state condition is achieved after the selected module has its operation level changed.

14. The method of claim 1, wherein obtaining the predicted change in the sensor value uses a transfer matrix, the method further comprising initializing the transfer matrix by:
receiving a first sensor value Y1 for each of the sensors;
changing an operation level of at least two actuators of the modules at a same time;
for each sensor:
after the change in operation levels, receiving a second sensor value Y2; and
calculating a difference between the first sensor value Y1 and the second sensor value Y2; and
determining at least a portion of matrix elements of the transfer matrix based on the differences, the transfer matrix having dimensions of a number of actuators by a number of sensors, wherein the portion includes matrix elements associated with the at least two actuators, and wherein determining a matrix element for sensor S and actuator P includes:
determining a first ratio having a numerator including the difference for sensor S and having a denominator including the change in operation level for actuator P; and
combining the first ratio with at least one other ratio, wherein the at least one other ratio is determined from a previous change of the operation level of actuator P that resulted in a previous difference in the sensor values for sensor S.

15. The method of claim 14, wherein combining the first ratio with at least one other ratio includes using a recursive least squares.

16. The method of claim 14, wherein the change in operation level of an actuator of a module is starting or stopping the respective module.

17. The method of claim 14, wherein combining the first ratio with at least one other ratio includes:
determining an error of the calculated difference relative to a predicted change in the sensor value for sensor S due to the change in operation level of actuator P; and
adding the error to the existing value for the matrix element for sensor S and actuator P, wherein the existing value was determined from the previous difference and previous change in the operation level of actuator P.

18. The method of claim 17, further comprising:
multiplying the error by a learning factor prior to the adding, wherein the learning factor is determined from a covariance matrix.

19. The method of claim 1, wherein determining the predicted change value uses a transfer matrix, the method further comprising initializing the transfer matrix by:
at least one processor determining the transfer matrix TM by:
for each one of the modules:
receiving a first sensor value Y1 for each of the sensors, each first sensor value being received when the respective module has a first operation level;
stopping or starting the respective module; and
after stopping or starting the respective module, for each sensor:
receiving a second sensor value Y2;
calculating a difference between the first sensor value Y1 and the second sensor value Y2; and
calculating a TM matrix element using the difference,
wherein the transfer matrix TM provides a relation between starting and/or stopping a module and resulting changes in the sensor values for each sensor.

20. The method of claim 19, wherein the matrix element equals (Y2−Y1) divided by a measure of capacity.

21. The method of claim 20, further comprising:
receiving a return temperature $TR_s$ and a discharge temperature $TD_s$ for each module P when all modules are running, wherein the operation level is a capacity measured by $$\% \text{ Cap} = \frac{F_P(TR_P - TD_P)}{F_D(TR_D - TD_D)},$$

where $F_P$ is the flow rate of the stopped module before being stopped, $TR_P$ is the return temperature of the respective module P before being stopped, $TD_P$ is the discharge temperature of the respective module P before its operation level is changed, $F_D$ is the design flow rate of the unit, and $TR_D$-$TD_D$ is the design change in temperature ($\Delta T$) of the respective module P.

22. The method of claim 19, further comprising:
calculating a load matrix by:
for each respective module $P_{indx}$:
for each other module $C_{indx}$, calculating a percent change in capacity ($\Delta\%$ Cap) that results from changing the operation level of the respective module $P_{indx}$; and
using each percent change to determine a load matrix element LOAD($C_{indx}$,$P_{indx}$),
wherein the load matrix provides a measure of the effect of changing the operation level of a module on the capacity of use of the remaining modules that remain on.

23. The method of claim 22, wherein $$\text{LOAD}(C_{indx}, S_{indx}) = \frac{\Delta \% \text{ Cap}}{\% \text{ Cap}_s},$$

wherein $\Delta\%$ Cap is the change in percent capacity of the module $C_{indx}$ induced by stopping the module $S_{indx}$, and wherein $\%$ $Cap_s$ is the percent capacity of the stopped module $P_{indx}$ prior to stopping.

24. The method of claim 23, where $$\% \text{ Cap} = \frac{F_P(TR_P - TD_P)}{F_D(TR_D - TD_D)},$$

and where $F_P$ is the flow rate of the stopped module before being stopped, $TR_P$ is the return temperature of the respective module $P_{indx}$ before being stopped, $TD_P$ is the discharge temperature of the respective module $P_{indx}$ before its operation level is changed, $F_D$ is the design flow rate of the unit, and $TR_D$-$TD_D$ is the design $\Delta T$ of the respective module $P_{indx}$.

25. A computer program product comprising a non-transitory computer readable medium storing a plurality of instructions for controlling a processor to perform an operation for controlling an environmental maintenance system including a plurality of environmental maintenance modules and a plurality of sensors that measure a value of a physical condition of an environment, the instructions comprising:
  identifying a sensor $S_{indx}$ whose sensor value is measured to be outside of a range;
  for each of at least a portion a plurality of the modules:
    identifying a change in value of an operation level for the module,
    using the change in value of the operation level as an input to a transfer function,
    obtaining a respective predicted change in the sensor value of the sensor $S_{indx}$ as an output of the transfer function the respective predicted change in the sensor value corresponding to the identified change in the operation level for the module;
  selecting at least one module based on the respective predicted change in the sensor value; and
  changing the operation level of the selected at least one module to effectuate a change of the sensor value of sensor $S_{indx}$.

26. An environmental maintenance system comprising:
  a plurality of environmental maintenance modules;
  a plurality of sensors that measure a value of a physical condition of an environment;
  the computer program product of claim 14; and
  at least one processor.

* * * * *

UNITED STATES PATENT AND TRADEMARK OFFICE
CERTIFICATE OF CORRECTION

PATENT NO. : 8,634,962 B2  
APPLICATION NO. : 12/860820  
DATED : January 21, 2014  
INVENTOR(S) : Federspiel et al.

Page 1 of 1

It is certified that error appears in the above-identified patent and that said Letters Patent is hereby corrected as shown below:

On the Title Page, (57) Abstract:

In the second column of the face sheet, at Item (57), line 8, please delete "hot sensor" and insert --the hot sensor--.

In the Claims:

Column 26, line 60, claim 11: Please delete "$TM_{NEW}(T_{indx}, S_{indx}) = \frac{T2-T1}{\Delta level}$" and insert -- $TM_{NEW}(S_{indx}, P_{indx}) = \frac{Y2-Y1}{\Delta level}$ --.

Column 28, line 48, claim 23: Please delete "$LOAD(C_{indx}, S_{indx}) = \frac{\Delta \% Cap}{\% Cap_s}$" and insert -- $LOAD(C_{indx}, P_{indx}) = \frac{\Delta \% Cap}{\% Cap_s}$ --.

Signed and Sealed this  
Twenty-seventh Day of May, 2014

Michelle K. Lee  
*Deputy Director of the United States Patent and Trademark Office*